United States Patent
Wakabayashi

(10) Patent No.: US 6,916,231 B2
(45) Date of Patent: Jul. 12, 2005

(54) POLISHING APPARATUS

(75) Inventor: Satoshi Wakabayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/662,396

(22) Filed: Sep. 16, 2003

(65) Prior Publication Data

US 2004/0072499 A1 Apr. 15, 2004

(30) Foreign Application Priority Data

Sep. 17, 2002 (JP) .............................. 2002-269642

(51) Int. Cl.$^7$ ............................................. B24B 1/00
(52) U.S. Cl. ...................... 451/66; 451/67; 451/285; 451/73; 451/286; 451/282; 451/288
(58) Field of Search ........................ 451/66, 67, 73, 451/285, 286–289, 290; 134/77, 78, 79, 160, 169, 158, 6, 902, 22, 32, 33; 438/690–693; 15/77, 88.2, 88.3, 182

(56) References Cited

U.S. PATENT DOCUMENTS

| | | | | |
|---|---|---|---|---|
| 3,182,668 A | * | 5/1965 | Hartsell ........................ 134/77 |
| 3,759,735 A | * | 9/1973 | Pekosh ......................... 427/64 |
| 5,655,954 A | * | 8/1997 | Oishi et al. ................... 451/67 |
| 5,738,574 A | | 4/1998 | Tolles et al. |
| 5,830,045 A | * | 11/1998 | Togawa et al. ............. 451/288 |
| 5,885,138 A | * | 3/1999 | Okumura et al. ............. 451/67 |
| 6,036,582 A | * | 3/2000 | Aizawa et al. ................ 451/41 |
| 6,494,768 B2 | * | 12/2002 | Inaba ......................... 451/287 |
| 6,575,816 B2 | * | 6/2003 | Hempel et al. ............... 451/41 |
| 6,629,539 B1 | * | 10/2003 | Yanagita et al. ............. 134/78 |
| 6,682,408 B2 | * | 1/2004 | Sakurai et al. ................ 451/67 |
| 2001/0044266 | | 11/2001 | Katsuoka et al. |

* cited by examiner

Primary Examiner—George Nguyen
(74) Attorney, Agent, or Firm—Wenderoth, Lind & Ponack, L.L.P.

(57) ABSTRACT

A polishing apparatus for polishing a workpiece has a polishing unit and a cleaning unit. The polishing unit has a polishing table having a polishing surface thereon, and a top ring for pressing the workpiece against the polishing surface. The cleaning unit has a rotatable shaft configured to be vertically movable, a holding mechanism mounted to the rotatable shaft for detachably holding the workpiece, and a plurality of cleaning devices disposed around the rotatable shaft for cleaning the workpiece which has been polished in the polishing unit.

5 Claims, 32 Drawing Sheets

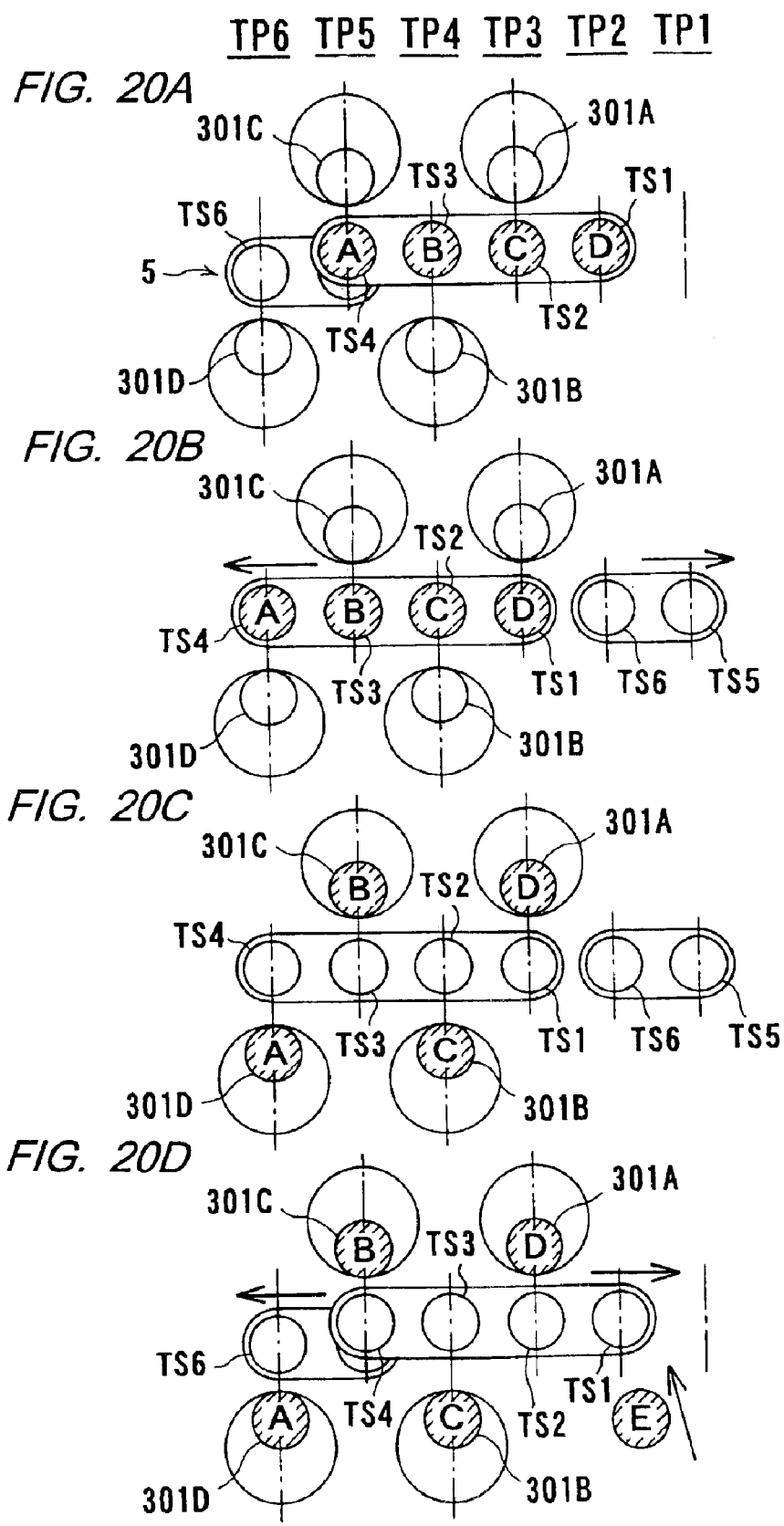

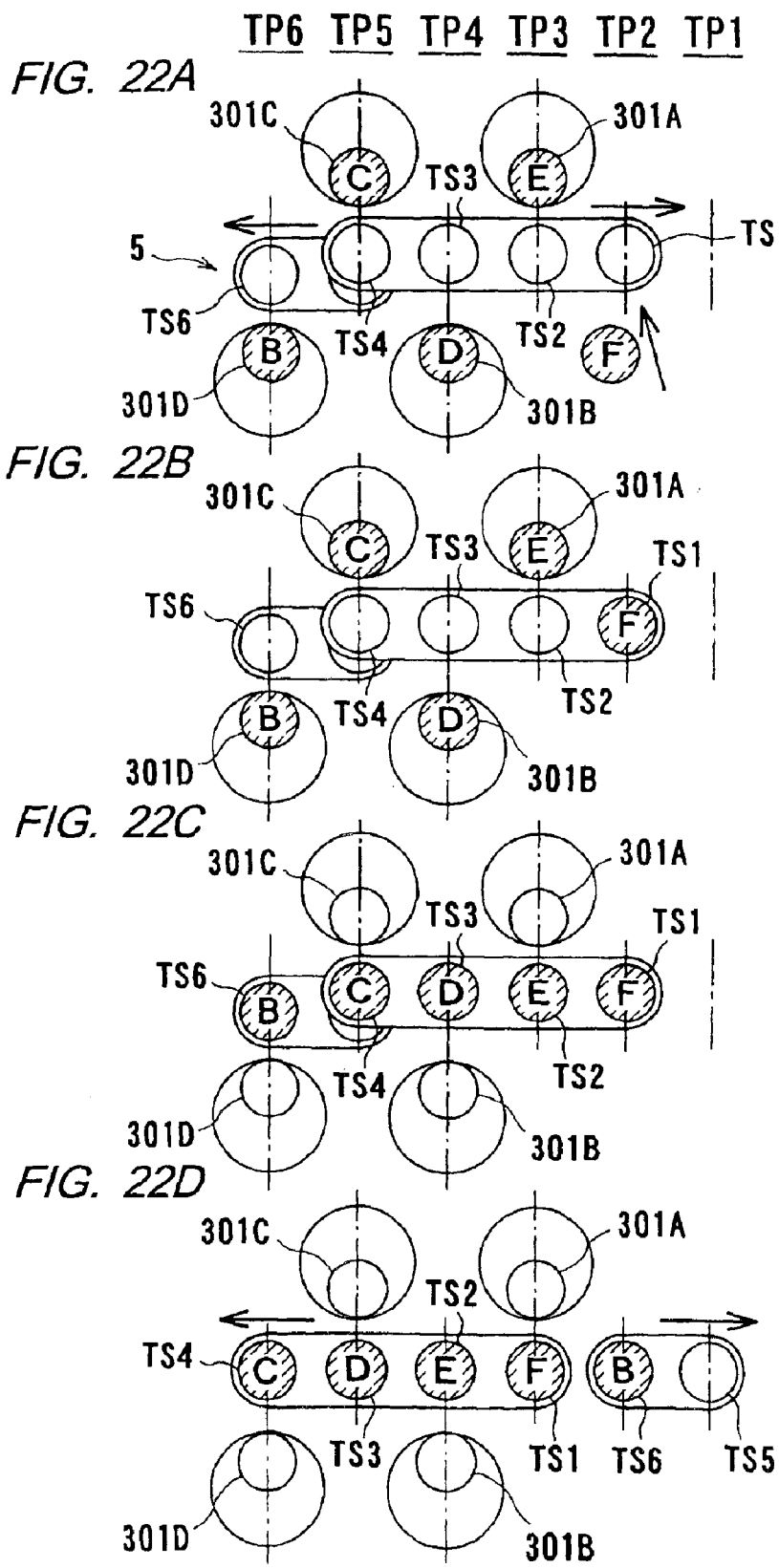

POLISHING APPARATUS

BACKGROUND OF THE INVENTION

1. Field of the Invention

The present invention relates to a substrate processing apparatus, and more particularly to a polishing apparatus for polishing a workpiece such as a semiconductor wafer to a flat mirror finish.

2. Description of the Related Art

As semiconductor devices have become more highly integrated in recent years, circuit interconnections have become finer and distances between those circuit interconnections have become smaller. In the case of photolithography, which can form interconnections that are at most 0.5 μm wide, it is required that surfaces on which pattern images are to be focused by a stepper should be as flat as possible because a depth of focus of an optical system is relatively small. A polishing apparatus for performing chemical mechanical polishing (CMP) has been used for planarizing such a semiconductor wafer.

This type of chemical mechanical polishing (CMP) apparatus comprises a polishing table having a polishing pad (polishing cloth) attached thereon, and a top ring for holding a workpiece to be polished, such as a semiconductor wafer, in a manner such that a surface to be polished faces the polishing table. The polishing pad has an upper surface serving as a polishing surface. In this polishing apparatus, the polishing table and the top ring are independently rotated, and, while an abrasive liquid (slurry) is being supplied onto the polishing pad, a workpiece is pressed against the polishing pad on the polishing table at a predetermined pressure by the top ring. Thus, a surface of the workpiece is polished to a flat mirror finish.

In many instances, such a polishing apparatus has a plurality of cleaning devices for cleaning a wafer which has been polished. Specifically, a conventional polishing apparatus has a plurality of cleaning devices arranged in parallel with each other. Accordingly, as the number of cleaning processes increases, the length of the polishing apparatus become larger, resulting in an increased footprint of the apparatus. In order to reduce the footprint of the apparatus, it has been attempted to employ a cleaning device which can receive a wafer placed along a vertical direction. However, when a wafer is placed along a vertical direction at the time of cleaning, the cleaning performance is adversely lowered.

SUMMARY OF THE INVENTION

The present invention has been made in view of the above drawbacks. It is, therefore, an object of the present invention to provide a polishing apparatus having a compact structure as a whole.

According to a first aspect of the present invention, there is provided a polishing apparatus for polishing a workpiece. The polishing apparatus has a polishing unit and a cleaning unit. The polishing unit has a polishing table having a polishing surface thereon, and a top ring for pressing the workpiece against the polishing surface. The cleaning unit has a rotatable shaft configured to be vertically movable, at least one holding mechanism mounted to the rotatable shaft for detachably holding the workpiece, and a plurality of cleaning devices disposed around the rotatable shaft for cleaning the workpiece which has been polished in the polishing unit.

With the above arrangement, a plurality of cleaning devices can be arranged in a reduced area within the polishing apparatus. Thus, the length of the apparatus can be reduced in a longitudinal direction to make the apparatus compact in size.

The plurality of cleaning devices may be disposed concentrically with the rotatable shaft. Thus, an efficient arrangement of the cleaning devices can be achieved. Further, a workpiece can be transferred between the cleaning devices merely by rotation of the shaft. Thus, it is possible to simplify the arrangement of the cleaning unit.

The holding mechanism may comprise a vacuum chucking mechanism. Alternatively, the holding mechanism may comprise a chucking member for holding a periphery of the workpiece.

The cleaning unit may comprise a plurality of holding mechanisms. With this arrangement, a plurality of workpieces can be transferred simultaneously, so that the throughput of the apparatus can be improved.

According to a second aspect of the present invention, there is provided a polishing apparatus for polishing a workpiece. The polishing apparatus has a plurality of polishing units. Each of the polishing units includes a polishing table having a polishing surface thereon, a top ring for pressing the workpiece against the polishing surface, and a moving mechanism for moving the top ring between a polishing position on the polishing surface and a workpiece receiving/delivering position. The polishing apparatus also has a linear transferring mechanism for transferring the workpiece between a plurality of transferring positions including the workpiece receiving/delivering position, and a receiving/delivering mechanism disposed at the workpiece receiving/delivering position for receiving and delivering the workpiece between the linear transferring mechanism and the top ring. The polishing apparatus also has a controller operable to operate the linear transferring mechanism so as to perform one of serial processing for a plurality of workpieces and parallel processing for a plurality of workpieces.

With the above arrangement, serial processing can selectively be performed when different types of slurry are used in the respective polishing units, for example, and parallel processing can selectively be performed in the case of a simple polishing process (e.g., primary and secondary polishing or only primary polishing). Thus, it is possible to maximize the throughput of the apparatus according to the intended use of the apparatus.

According to a third aspect of the present invention, there is provided a substrate processing apparatus for processing a substrate. The substrate processing apparatus has a transferring mechanism for transferring the substrate. The transferring mechanism includes chucking members for holding a periphery of the substrate and at least one air cylinder to operate the chucking members. The air cylinder has a valve member and cylinder chambers defined in the air cylinder by the valve member. The transferring mechanism also includes a suction device for evacuating one of the cylinder chambers, which is located on a side of the chucking members.

Thus, when the chucking member is moved toward the substrate, the cylinder chamber located on a side of the chucking member is evacuated by the suction device. Since the pressure in the cylinder chamber located on a side of the chucking member becomes lower than an external pressure (atmospheric pressure), it is possible to prevent particles in the cylinder chamber from being scattered over the chucking member and the substrate.

The above and other objects, features, and advantages of the present invention will be apparent from the following description when taken in conjunction with the accompanying drawings which illustrate preferred embodiments of the present invention by way of example.

BRIEF DESCRIPTION OF THE DRAWINGS

FIGS. 20A through 20D are schematic diagrams explanatory of operation of the linear transporter in the polishing section shown in FIG. 1 when serial processing is performed;

FIGS. 22A through 22D are schematic diagrams explanatory of operation of the linear transporter in the polishing section shown in FIG. 1 when serial processing is performed;

DETAILED DESCRIPTION OF THE PREFERRED EMBODIMENTS

A polishing apparatus according to embodiments of the present invention will be described below with reference to the accompanying drawings.

Figure 1:
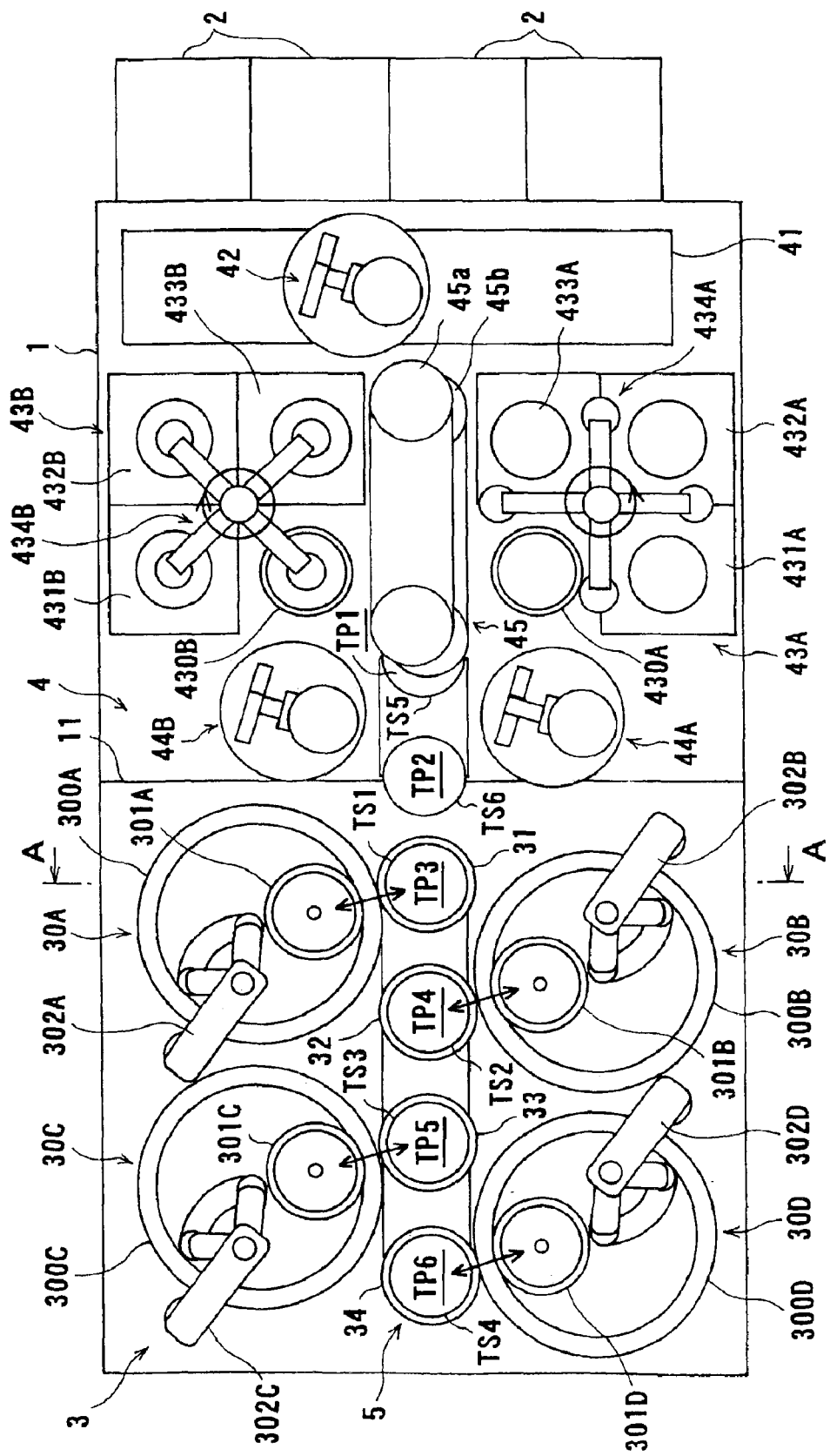
FIG. 1 is a plan view showing an entire arrangement of a polishing apparatus according to an embodiment of the present invention.

FIG. 1 is a plan view showing an entire arrangement of a polishing apparatus according to an embodiment of the present invention. As shown in FIG. 1, the polishing apparatus has a housing, e.g., a substantial rectangular housing 1, and two or more loading/unloading stages 2 disposed at a longitudinal end of the housing 1. In the illustrated embodiment, the polishing apparatus has four loading/ unloading stages 2. The housing 1 has a partition wall 11 provided therein for partitioning the interior of the housing 1 into a polishing section 3 for polishing a workpiece and a cleaning section 4 for cleaning the workpiece which has been polished in the polishing section 3.

The loading/unloading stages 2 serve to receive a wafer cassette thereon which stores a number of semiconductor wafers. In the present embodiment, four loading/unloading stages 2 are disposed adjacent to each other along a width direction of the polishing apparatus, i.e., along a direction perpendicular to a longitudinal direction of the polishing apparatus. The loading/unloading stages 2 can receive thereon an open cassette, a standard manufacturing interface pod (SMIF), or a front opening unified pod (FOUP). The SMIF and FOUP have a hermetically sealed container including a partition wall for covering and housing a wafer cassette therein so as to maintain the interior of the container as an environment independent of an external space.

The cleaning section 4 has a moving mechanism 41 extending in a direction along which the loading/unloading stages 2 are arranged, and a first transfer robot 42 disposed on the moving mechanism 41. Thus, the first transfer robot 42 is configured so as to be movable in a direction along which the wafer cassettes on the loading/unloading stages 2 are arranged. Specifically, the first transfer robot 42 can move on the moving mechanism 41 and is accessible to each of the wafer cassettes mounted on the loading/unloading stages 2. The first transfer robot 42 has a reversing mechanism for reversing a wafer.

As described above, the cleaning section 4 serves as an area for cleaning a semiconductor wafer which has been polished. As shown in FIG. 1, the cleaning section 4 includes therein a first cleaning unit 43A, a second cleaning unit 43B, a second transfer robot 44A disposed adjacent to the first cleaning unit 43A, a third transfer robot 44B disposed adjacent to the second cleaning unit 43B, and a linear transporter 45 disposed between the first cleaning unit 43A and the second cleaning unit 43B.

The linear transporter 45 in the cleaning section 4 includes two transfer stages, i.e., an upper transfer stage 45a and a lower transfer stage 45b. Each of the transfer stages 45a and 45b is arranged so as to move in the longitudinal direction of the apparatus. While the upper transfer stage 45a and the lower transfer stage 45b move on the same axis in the plan view shown in FIG. 1, the upper transfer stage 45a and the lower transfer stage 45b can freely move without interfering with each other because they are provided at different heights. Each of the transfer stages 45a and 45b serves to transfer a wafer between a wafer receiving/delivering position for the first transfer robot 42 and a wafer receiving/delivering position for the second transfer robot 44A or for the third transfer robot 44B. Since the linear transporter 45 has the upper and lower transfer stages 45a, 45b, two wafers can simultaneously be transferred between the wafer receiving/delivering position for the first transfer robot 42 and the wafer receiving/delivering position for the second transfer robot 44A or for the third transfer robot 44B. Accordingly, the transfer robots 42, 44A, and 44B can reduce the time required for transferring a wafer.

The first cleaning unit 43A has a reversing machine 430A for reversing a semiconductor wafer introduced by the second transfer robot 44A, three cleaning devices 431A, 432A, and 433A for cleaning a wafer which has been polished, and a transferring mechanism 434A for transferring a wafer between the reversing machine 430A, the cleaning device 431A, the cleaning device 432A, and the cleaning device 433A. The reversing machine 430A is disposed at a location such that a hand of the second transfer robot 44A is accessible to the reversing machine 430A, and receives a wafer which has been polished from the second transfer robot 44A and turns the wafer upside down.

Similarly, the second cleaning unit 43B has a reversing machine 430B for reversing a semiconductor wafer introduced by the third transfer robot 44B, three cleaning devices 431B, 432B, and 433B for cleaning a wafer which has been polished, and a transferring mechanism 434B for transferring a wafer between the reversing machine 430B, the cleaning device 431B, the cleaning device 432B, and the cleaning device 433B. The reversing machine 430B is disposed at a location such that a hand of the third transfer robot 44B is accessible to the reversing machine 430B, and receives a wafer which has been polished from the third transfer robot 44B and turns the wafer upside down.

As described above, the polishing section 3 serves as an area for polishing a semiconductor wafer. As shown in FIG. 1, the polishing section 3 includes therein a first polishing unit 30A, a second polishing unit 30B, a third polishing unit 30C, and a fourth polishing unit 30D. The first polishing unit 30A and the third polishing unit 30C are disposed adjacent to each other along the longitudinal direction of the apparatus, and the second polishing unit 30B and the fourth polishing unit 30D are disposed adjacent to each other along the longitudinal direction of the apparatus. The first and third polishing units 30A, 30C are arranged in parallel with the second and fourth polishing units 30B, 30D.

As shown in FIG. 1, the first polishing unit 30A includes a polishing table 300A having a polishing surface thereon, a top ring 301A for holding a semiconductor wafer and pressing the wafer against the polishing table 300A to polish the wafer, a dresser 302A for dressing the polishing surface on the polishing table 300A, a polishing liquid supply nozzle (not shown) for supplying a polishing liquid or a dressing liquid (e.g., water) onto the polishing table 300A, and an atomizer (not shown) having one or more nozzles for ejecting a mixture of a liquid (e.g., pure water) and a gas (e.g., nitrogen) in an atomized state toward the polishing surface on the polishing table 300A.

Similarly, the second polishing unit 30B includes a polishing table 300B, a top ring 301B, a dresser 302B, a polishing liquid supply nozzle, and an atomizer. The third polishing unit 30C includes a polishing table 300C, a top ring 301C, a dresser 302C, a polishing liquid supply nozzle, and an atomizer. The fourth polishing unit 30D includes a polishing table 300D, a top ring 301D, a dresser 302D, a polishing liquid supply nozzle, and an atomizer.

As shown in FIG. 1, the polishing section 3 has a linear transporter 5 disposed between the first and third polishing units 30A, 30C and the second and fourth polishing units 30B, 30D. The linear transporter 5 in the polishing section 3 serves as a (linear) transferring mechanism for transferring a wafer between six transferring positions located along the longitudinal direction of the apparatus. As shown in FIG. 1, the transferring positions includes a first transferring position TP1, a second transferring position TP2, a third transferring position TP3, a fourth transferring position TP4, a fifth transferring position TP5, and a sixth transferring position TP6, in the order from the loading/unloading stages 2.

The polishing section 3 has a first vertically movable pusher 31 disposed below the third transferring position TP3, a second vertically movable pusher 32 disposed below the fourth transferring position TP4, a third vertically movable pusher 33 disposed below the fifth transferring position TP5, and a fourth vertically movable pusher 34 disposed below the sixth transferring position TP6.

Figure 2A:
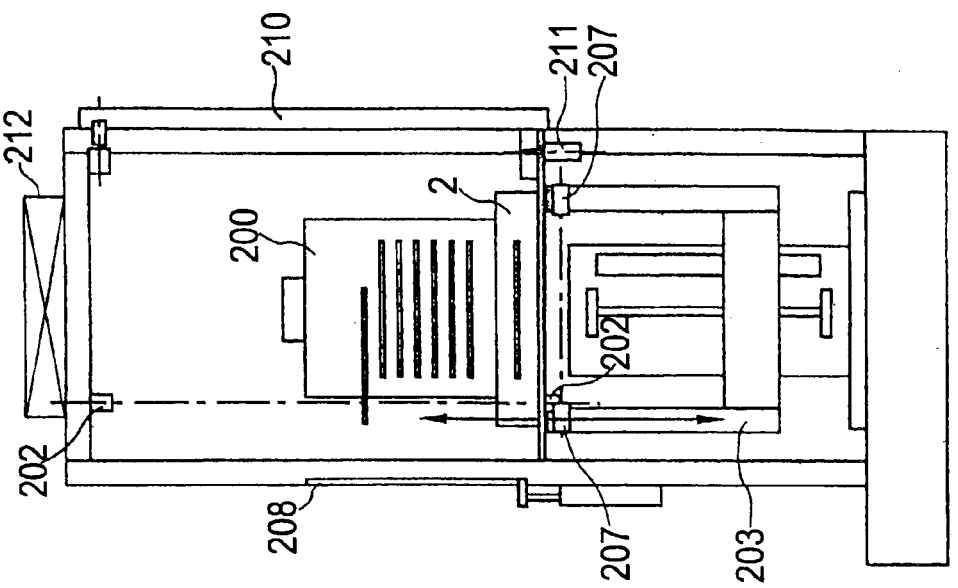
FIG. 2A is a front view showing loading/unloading stages of the polishing apparatus shown in FIG. 1.

The loading/unloading stages 2 will be described below with reference to FIGS. 2A and 2B. FIG. 2A is a front view showing the loading/unloading stages 2 in FIG. 1, and FIG. 2B is a side view of FIG. 2A.

Figure 2B:
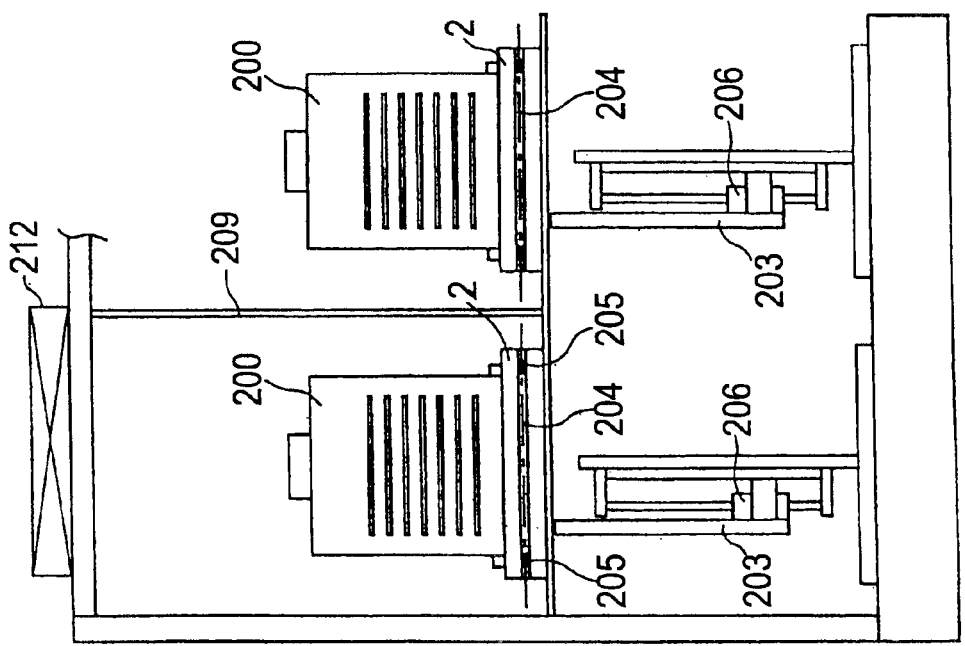
FIG. 2B is a side view of the loading/unloading stages shown in FIG. 2A.

As shown in FIGS. 2A and 2B, the loading/unloading stages 2 serve to receive a wafer cassette 200 thereon which stores a number of semiconductor wafers. The loading/unloading stages 2 have a positioning mechanism in the form of a block configured to match the shape of a lower portion of the wafer cassette 200. Therefore, the wafer cassette 200 is held in the same position whenever the wafer cassette 200 is placed on the loading/unloading stages 2. The loading/unloading stages 2 have a button-type sensor (not shown) for detecting the presence of the wafer cassette 200 when the wafer cassette 200 is placed in a proper position. Further, the loading/unloading stages 2 have a pair of transmission optical sensors 202 disposed above and below the wafer cassette 200 for detecting whether any wafer projects from the wafer cassette 200. Specifically, the transmission optical sensors 202 are arranged so that light between the transmission optical sensors 202 is blocked by a wafer that projects from the wafer cassette 200 by a predetermined length. Thus, the transmission optical sensors 202 can detect a wafer that projects from the wafer cassette 200 and determine whether wafers are properly received in respective slots of the wafer cassette 200. If the transmission optical sensors 202 detect any wafer that projects from the wafer cassette 200, then an interlocking mechanism is operated to control the first transfer robot 42 and a searching mechanism 203 so as not to access the wafer cassette 200. Analysis of an image obtained by a CCD camera may be utilized for detecting whether any wafer projects from the wafer cassette 200. Alternatively, a reflection-type sensor which detects reflected light from an end surface of a wafer into which light is emitted may be utilized for detecting whether any wafer projects from the wafer cassette 200.

As shown in FIG. 2A, dummy wafer stations 204 are disposed below the respective loading/unloading stages 2. Each of the dummy wafer stations 204 can receive one or more wafers placed thereon. For example, a dummy wafer used for stabilizing a polishing surface before a product wafer is processed, or a quality control (QC) wafer to be transferred for obtaining the status or conditions of the polishing apparatus may be held in the dummy wafer stations 204. Each of the dummy wafer stations 204 has a pair of sensors 205 provided therein for detecting the presence of a wafer. Thus, the sensors 205 can detect whether a wafer is held in the dummy wafer station 204. When no wafer cassette is placed on the loading/unloading stage 2, the loading/unloading stage 2 located above the dummy wafer station 204 may be lifted to place a wafer manually on the dummy wafer station 204.

According to a standard procedure, a wafer cassette 200 having wafers inserted therein is placed on any one of the loading/unloading stages 2, and then searching of the wafers is performed. Thereafter, a control panel sends commands indicating which wafer is to be delivered to each dummy wafer station 204. The selected wafer is delivered from the wafer cassette 200 to the dummy wafer station 204 by the first transfer robot 42, which is accessible to the wafer cassette 200 and the dummy wafer station 204. Alternatively, a dummy wafer may be placed on one of the loading/unloading stages 2, which then serves as a dummy wafer station.

As shown in FIGS. 2A and 2B, wafer searching mechanisms 203 are disposed below the respective loading/unloading stages 2. If dummy wafer stations are provided, the wafer searching mechanisms 203 are disposed below the dummy wafer stations. Each of the wafer searching mechanisms 203 is vertically movable by a driving source 206 comprising a pulse motor. As shown in FIG. 2B, the wafer searching mechanism 203 has a pair of wafer searching sensors 207 mounted on the tip end of the wafer searching mechanism 203. When the wafer searching mechanisms 203 are not in operation for wafer searching, the wafer searching mechanisms 203 are held in a standby position, which is within the apparatus, in order not to interfere with other operating members. The wafer searching sensors 207 are disposed in confronting relation to each other such that light traveling between the pair of wafer searching sensors 207 passes horizontally through the wafer cassette 200 as viewed from a side of the loading/unloading stages 2.

A wafer searching operation is performed as follows. The wafer searching mechanism 203 moves up from a position below the dummy wafer station 204 to a position above a final slot in the wafer cassette 200 and then moves down to the position below the dummy wafer station 204. During this movement, the pair of the wafer searching sensors 207 counts the number of times that the light is interrupted by a wafer, thereby counting the number of wafers in the wafer cassette 200. At that time, the wafer searching mechanism 203 determines the positions of the wafers based on the pulses of the pulse motor 206, thereby determining which slots in the wafer cassette 200 the wafers are inserted into. The wafer searching mechanism 203 also has an oblique wafer detecting function, which detects an obliquely inserted wafer when the light between the wafer searching sensors 207 is interrupted for a period of time corresponding to the number of pulses that is greater than the number of pulses corresponding to a spacing between the slots in the wafer cassette 200. The spacing between the slots in the wafer cassette 200 is preset in advance.

As shown in FIG. 2B, a shutter 208 is disposed between an opening in the wafer cassette 200 and an apparatus body. The shutter 208 is vertically movable by an air cylinder. Thus, the shutter 208 can separate the cassette placing area and the interior of the apparatus body. The shutter 208 is closed except when the first transfer robot 42 transfers a wafer to or from the wafer cassette 200.

As shown in FIG. 2A, partition walls 209 are disposed between the adjacent loading/unloading stages 2 arrayed in front of the apparatus. Thus, with the partition walls 209, when an operator accesses a processed wafer cassette for replacement, the operator is prevented from touching an adjacent wafer cassette which is in operation.

As shown in FIG. 2B, doors 210 are provided in front of the respective loading/unloading stages 2 for separating the interior of the apparatus from the exterior of the apparatus. The door 210 has a locking mechanism and a sensor 211 for detecting whether the door 210 is opened or closed. When the apparatus is in operation, the doors 210 are locked by the locking mechanisms to protect the wafer cassette 200 and forestall danger to the operator. If any one of the doors 210 is left opened for a certain period of time, then an alarm is issued.

The following two methods may be used in order to place a wafer cassette 200 on one of the loading/unloading stages 2.

(1) A wafer cassette 200 having wafers therein is placed directly on one of the loading/unloading stages 2. This process is employed when a chamber of a clean room facing the loading/unloading stages 2 is relatively clean, e.g., it has a clean room environment of class 100 or lower.

(2) When a chamber of a clean room facing the loading/unloading stages 2 is relatively dirty, e.g., it has a clean room environment of class 1000 or higher, a wafer cassette 200 is placed in a box, which is controlled at a clean room environment of about class 100, and delivered in the clean room and placed on one of the loading/unloading stages 2.

In the case of (1) above, it is desirable that a filter fan unit 212 (see FIG. 2B) is mounted above the loading/unloading stages 2 for maintaining the loading/unloading stages 2 clean.

The cleaning units 43A and 43B in the cleaning section 4 will be described below. The first cleaning unit 43A and the second cleaning unit 43B have substantially the same structure. Although the following description relates only to the first cleaning unit 43A, it can be applied to the second cleaning unit 43B.

Figure 3:
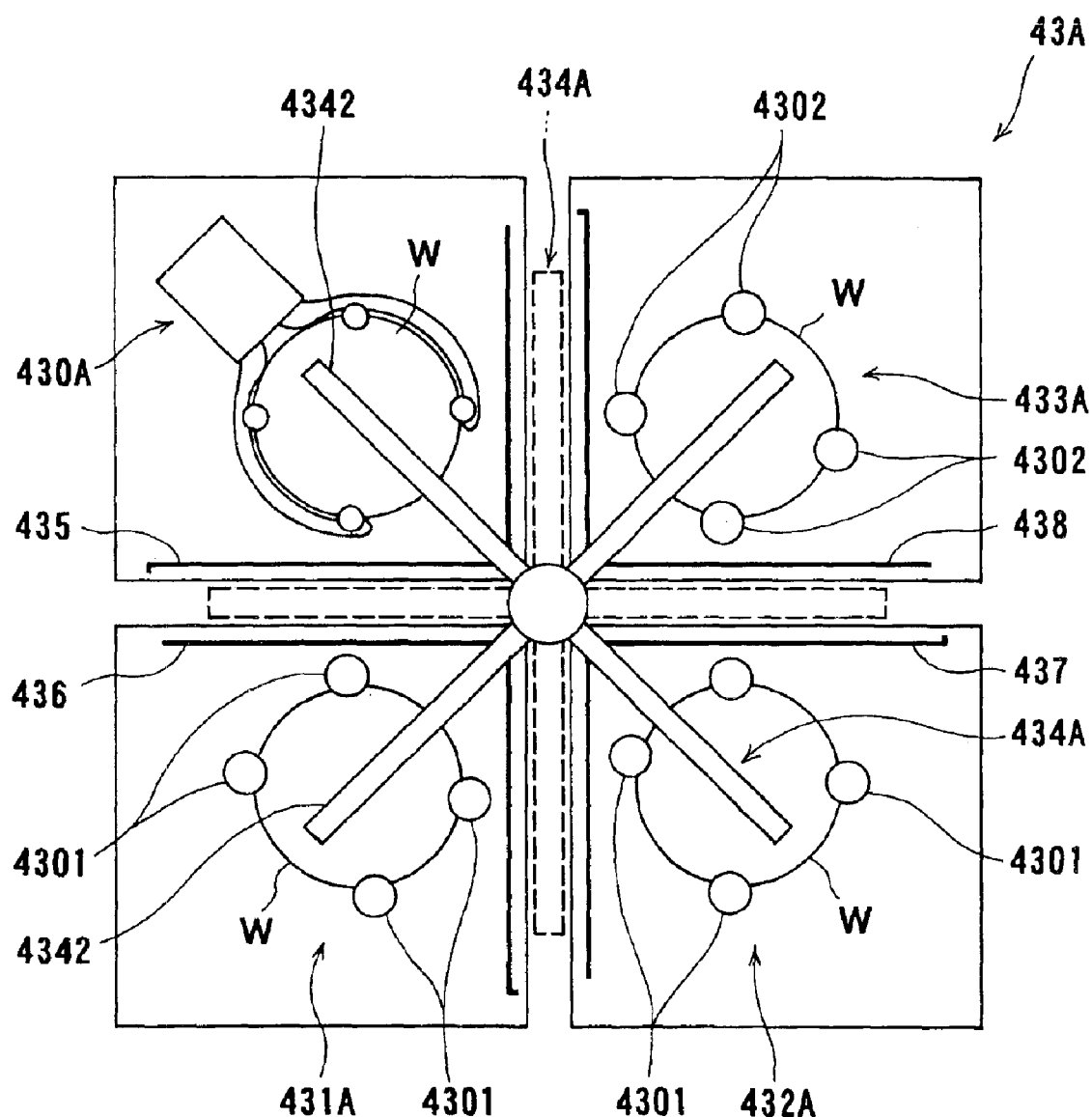
FIG. 3 is a plan view schematically showing a first cleaning unit in the polishing apparatus shown in FIG. 1.

FIG. 3 is a plan view schematically showing the first cleaning unit 43A in the polishing apparatus shown in FIG. 1. As shown in FIG. 3, the reversing machine 430A and the cleaning devices 431A, 432A, and 433A are disposed adjacent to each other, and have shutters 435, 436, 437, and 438 provided at adjacent sidewalls, respectively. The reversing machine 430A and the cleaning device 431A, 432A, and 433A are surrounded by a waterproof cover (not shown). When a wafer is not transferred in the cleaning units 43A, the shutters 435, 436, 437, and 438 are closed to prevent contaminants from being scattered from the cleaning devices 431A, 432A, and 433A. When the transferring mechanism 434A is not in operation, the transferring mechanism 434A is held in a standby position, which is represented by dotted lines in FIG. 3.

As shown in FIG. 3, the primary cleaning device 431A and the secondary cleaning device 432A have at least three chucking members 4301 for holding a periphery of a wafer W respectively. In the illustrated example, four chucking members 4301 are provided in each of cleaning devices 431A and 432A. The chucking members 4301 are arranged so as to be movable in a radial direction of the wafer W. Thus, the chucking members 4301 can hold and release the wafer W by their radial movement.

Each of the chucking members 4301 is connected to a motor (not shown) for rotating the chucking members 4301 in synchronism with each other. By driving the motor, a wafer can be rotated at a rotational speed proportional to a rotational speed of the chucking members 4301 in a state such that the periphery of the wafer W is held in grooves defined in the chucking members 4301. The power of the motor may be transmitted to the respective chucking members 4301 via transmitting belts.

For example, the primary cleaning device 431A and the secondary cleaning device 432A may comprise a roll-type cleaning device, which presses upper and lower roll sponges being rotated against front and rear surfaces of a wafer, respectively, to perform scrub-cleaning of the front and rear surfaces of the wafer. The roll sponges are vertically movable by actuators, and pressing forces which the sponges apply to the wafer are adjustable by regulators. The sponges are supplied with pure water through pure water supply pipes connected to the sponges, so that the wafer can be cleaned with sufficiently wet sponges. The sponges may be vertically moved by motors, and the pressing forces may be controlled based on rotational angles of the motors.

The tertiary cleaning device 433A has at least three chucking members 4302 for holding a periphery of a wafer W. In the illustrated example, four chucking members are provided in the tertiary cleaning device 433A. The tertiary cleaning device 433A has a stage for rotating a wafer held by the chucking members 4302 at a high rotational speed. Thus, the tertiary cleaning device 433A has a spin-drying function for scattering liquid on a wafer after cleaning to dry the wafer by rotating the wafer at a high rotational speed.

For example, the tertiary cleaning device 433A may comprise a pencil-type cleaning device, which rotates and presses a hemispherical sponge against a wafer to perform scrub-cleaning of a surface of the wafer. The sponge is vertically movable by an actuator, and a pressing force which the sponge applies to the wafer is adjustable by a regulator. The pencil sponge is mounted on a swing arm, so that the pencil sponge can be swung by a swinging motion of the swing arm. The tertiary cleaning device 433A has a pair of transmission optical sensors for detecting whether the sponge is removed from a main body. If the sponge is removed from the main body, the operation of the apparatus can be stopped in response to detection by the transmission optical sensors.

Each of the cleaning devices 431A, 432A, and 433A has a pair of transmission sensors (not shown) located above and below the wafer W for detecting the presence of a wafer, and a cleaning liquid supply nozzle (not shown) directed toward a wafer W for supplying a cleaning liquid such as a chemical liquid or pure water to the wafer W. Each of the cleaning devices 431A, 432A, and 433A has an ultrasonic cleaning nozzle (not shown) disposed near a peripheral edge of the wafer W for supplying a cleaning liquid vibrated by ultrasonic waves to the wafer W to clean the wafer W. The cleaning liquid may be supplied from the ultrasonic cleaning nozzle to any one of the front, rear, or edge surface of the wafer W according to the intended use. The ultrasonic cleaning can remove particles, which would be difficult to be removed by the aforementioned sponges, from the wafer W. Alternatively, the ultrasonic cleaning may be employed before the cleaning process with the sponges to prevent contamination of the sponges so as to prolong the lifetime of the sponges.

The interiors of the cleaning devices 431A, 432A, and 433A are continuously evacuated to maintain the interiors of the cleaning devices 431A, 432A, and 433A at negative pressures. When the respective cleaning devices 431A, 432A, and 433A have independent discharge air/liquid lines, by-products are not produced even if different chemical liquids are used in the respective cleaning devices.

Figure 4A:
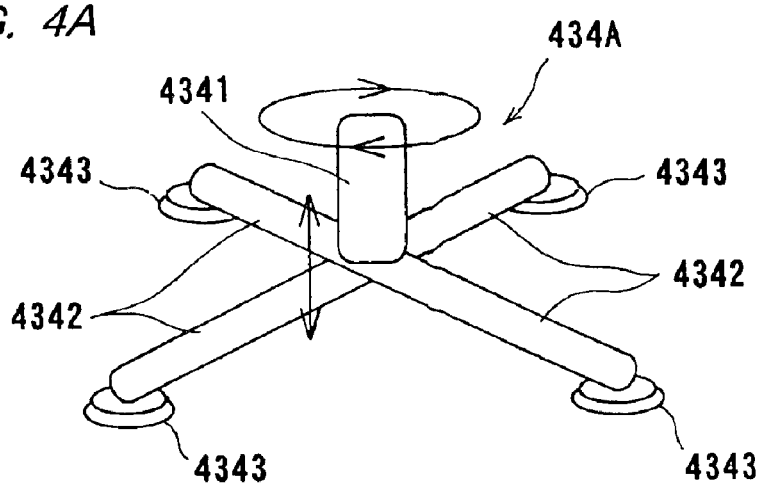
FIG. 4A is a perspective view schematically showing a transferring mechanism in the first cleaning unit shown in FIG. 3.

The transferring mechanism 434A in the first cleaning unit 43A will be described below. FIG. 4A is a perspective view schematically showing the transferring mechanism 434A in the first cleaning unit 43A shown in FIG. 3, and FIG. 4B is a perspective view schematically showing a tip portion of a rotating arm of the transferring mechanism 434A shown in FIG. 4A.

As shown in FIG. 4A, the transferring mechanism 434A has a shaft 4341 which is vertically movable and rotatable about its axis, and four rotating arms 4342 mounted on a lower end of the shaft 4341. As shown in FIG. 4B, each of the rotating arms 4342 has a vacuum chucking mechanism 4343 provided near the tip thereof. The vacuum chucking mechanism 4343 serves as a holding mechanism for detachably holding a wafer W. The vacuum chucking mechanism 4343 attracts a wafer W by suction, and then the shaft 4341 is lifted and rotated to transfer the wafer W from the reversing machine 430A to the primary cleaning device 431A, from the primary cleaning device 431A to the secondary cleaning device 432A, or from the secondary cleaning device 432A to the tertiary cleaning device 433A. Specifically, the reversing machine 430A and the cleaning devices 431A, 432A, and 433A are disposed concentrically with the shaft 4341 of the transferring mechanism 434A so as to surround the shaft 4341. By rotating the shaft 4341, a plurality of wafers can be transferred simultaneously. The vacuum chucking mechanism 4343 has a sensor for measuring the degree of vacuum to detect the presence of a wafer.

Figure 4B:
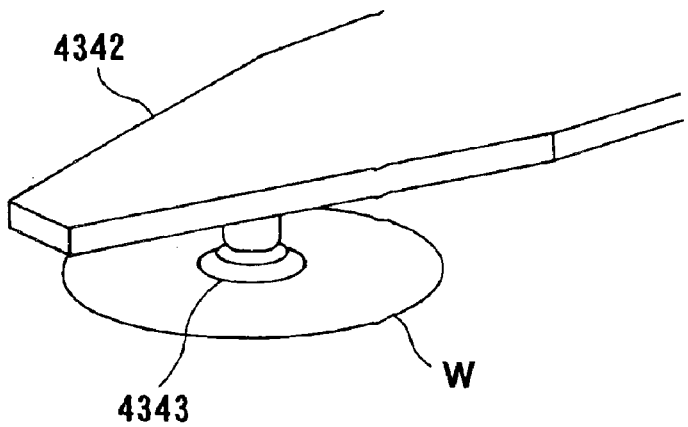
FIG. 4B is a perspective view schematically showing a tip portion of a rotating arm of the transferring mechanism shown in FIG. 4A.
Figure 4C:
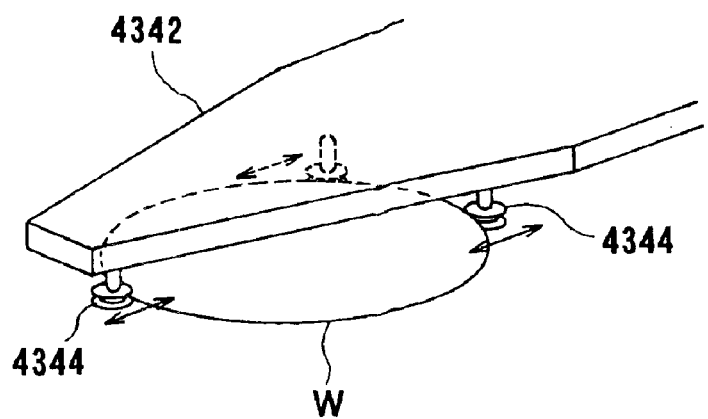
FIG. 4C is a perspective view schematically showing a tip portion of a rotating arm of a transferring mechanism according to another embodiment of the present invention.

As shown in FIG. 4C, chucking members 4344 may be used to hold a periphery of a wafer W instead of the vacuum chucking mechanism 4343 shown in FIG. 4B. Recently, in a substrate processing apparatus including a polishing apparatus, a transferring mechanism for clamping end surface of a wafer as shown in FIG. 4C has been employed in order to reduce particles attached to a rear face of the wafer.

Figure 5A:
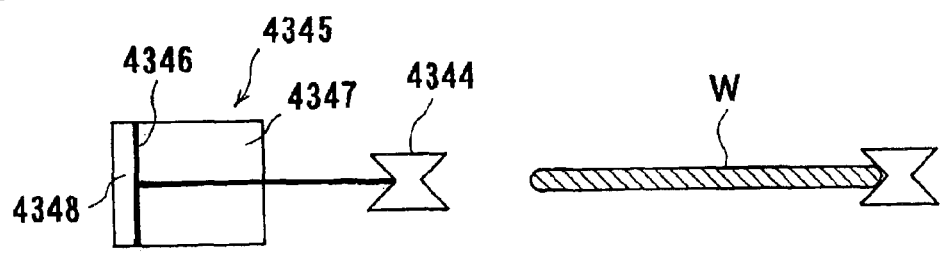
FIGS. 5A and 5B are schematic views showing a moving mechanism of a chucking member shown in FIG. 4C.
Figure 5B:
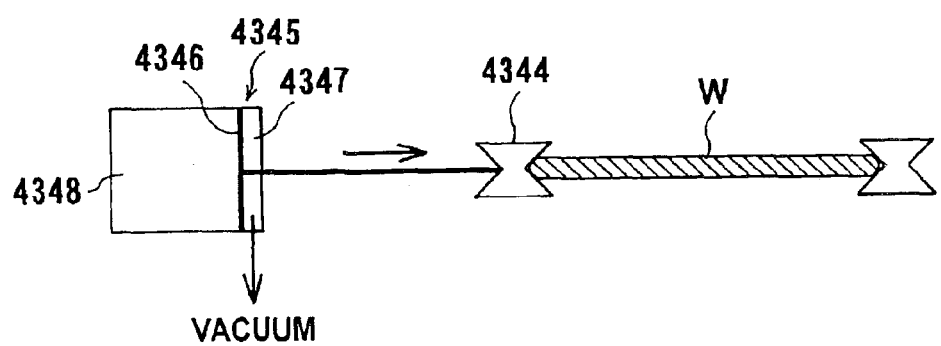

The holding mechanism shown in FIG. 4C has at least three chucking members 4344 mounted on the lower surface of the rotating arm 4342. As shown in FIG. 5A, the chucking members 4344 are connected to air cylinders 4345 for horizontally moving the chucking members 4344. Thus, the chucking members 4344 can hold and release the wafer W by their horizontal movement via the air cylinders 4345.

Figure 5C:
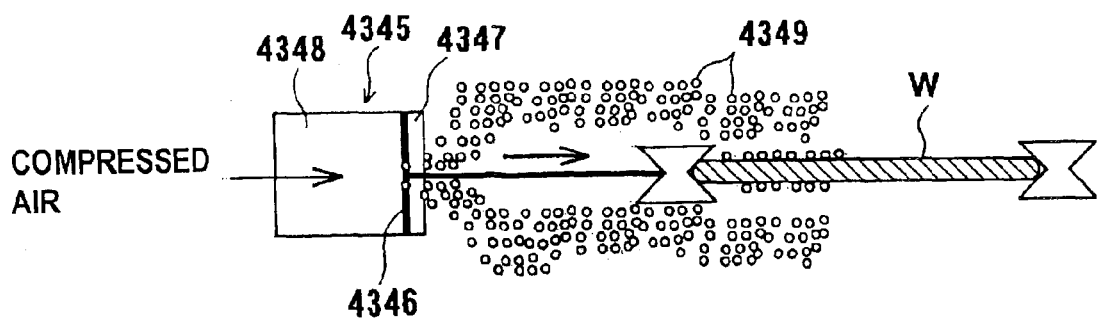
FIG. 5C is a schematic view explanatory of an effect of the moving mechanism shown in FIG. 5B.

The air cylinder 4345 has a valve member 4346, and cylinder chambers 4347, 4348 defined in the air cylinder 4345 by the valve member 4346. The cylinder chamber 4347 located on a side of the chucking member 4344 is connected to a suction device (not shown) such as a vacuum pump. When the chucking member 4344 is to be moved toward the wafer W, the suction device is operated to lower the pressure of the cylinder chamber 4347 located on the side of the chucking member 4344 below the pressure of the cylinder chamber 4348. Thus, the chucking member 4344 is moved toward the wafer W. At that time, the pressure of the cylinder chamber 4347, located by the chucking member 4344, becomes lower than the external pressure (atmospheric pressure). Therefore, it is possible to prevent particles in the cylinder chamber 4347 from being scattered over the chucking member 4344 and the wafer W. Specifically, if compressed air or the like is supplied to the cylinder chamber 4348 to move the chucking member 4344 toward the wafer W, then the valve member 4346 compresses the cylinder chamber 4347 located on the side of the chucking member 4344 to increase the pressure of the cylinder chamber 4347 above the external pressure (atmospheric pressure). In such a case, air flows out from the cylinder chamber 4347, so that particles 4349 in the cylinder chamber 4347 are scattered over the chucking member 4344 and the wafer W, as shown in FIG. 5C. As described above, according to the present invention, the pressure of the cylinder chamber 4347 located on the chucking member 4344 is lowered below the pressure of the cylinder chamber 4348 by the suction device. Since the pressure of the cylinder chamber 4347 located on the chucking member 4344 becomes lower than the atmospheric pressure, it is possible to prevent particles in the cylinder chamber 4347 from being scattered over the chucking member 4344 and the wafer W. Such a structure is applicable not only to a transferring mechanism for transferring a wafer in the cleaning section 4, but also to any transferring mechanisms for transferring a wafer in a substrate processing apparatus.

Operation of the transferring mechanism 434A thus constructed will be described below with reference to FIGS. 6A through 8C. Although the transferring mechanism 434A has four rotating arms 4342, only three rotating arms are shown in FIGS. 6A through 8C for purposes of illustration.

Figure 6A:
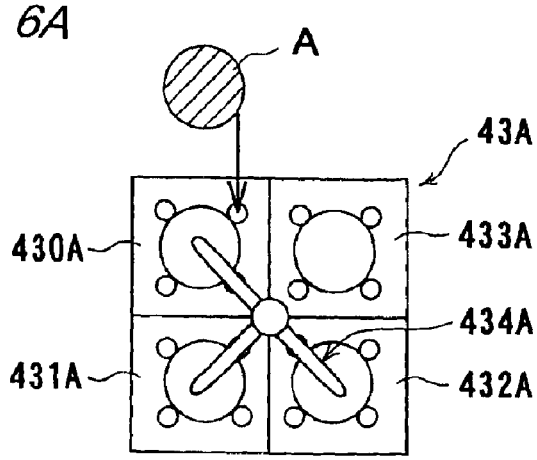
FIGS. 6A through 6D are schematic diagrams explanatory of a transferring process of the first cleaning unit shown in FIG. 3.
Figure 6B:
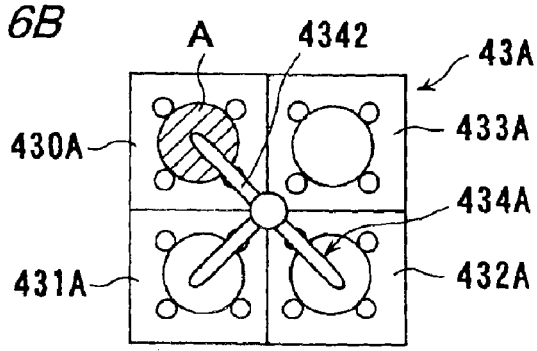
Figure 6C:
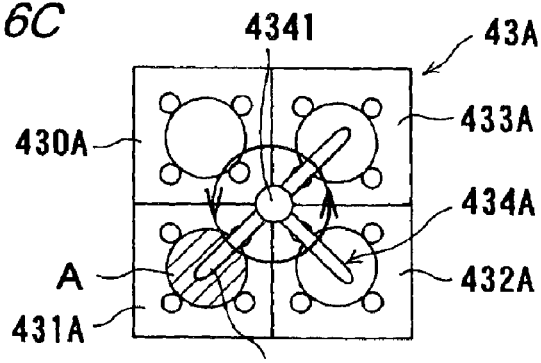
Figure 6D:
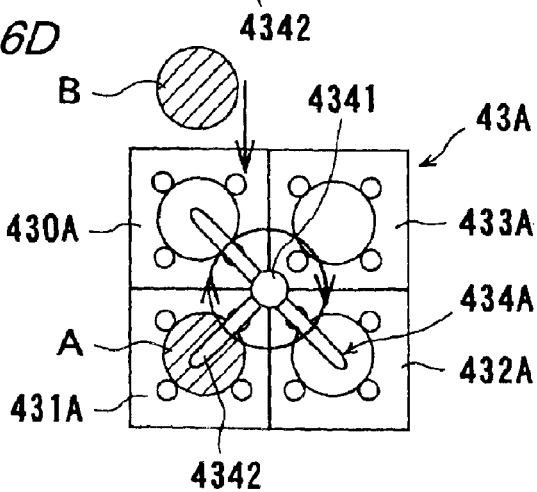

First, the second transfer robot 44A transfers a polished wafer A to the reversing machine 430A (see FIG. 6A). The reversing machine 430A turns the wafer A upside down, and the reversed wafer A is held by the holding mechanism of the rotating arm 4342 (see FIG. 6B). Then, the shaft 4341 of the transferring mechanism 434A is rotated to transfer the wafer A to the primary cleaning device 431A, where the wafer A is cleaned (see FIG. 6C). Thereafter, the rotating arm 4342 is returned to the original position, and the second transfer robot 44A transfers another polished wafer B to the reversing machine 430A (see FIG. 6D).

Figure 7A:
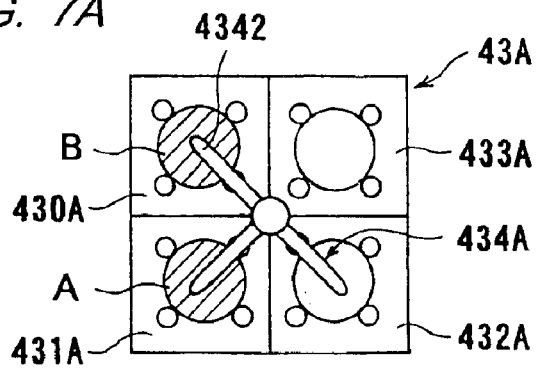
FIGS. 7A through 7D are schematic diagrams explanatory of a transferring process of the first cleaning unit shown in FIG. 3.
Figure 7B:
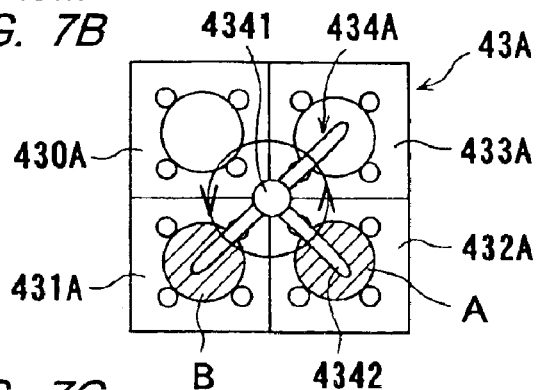
Figure 7C:
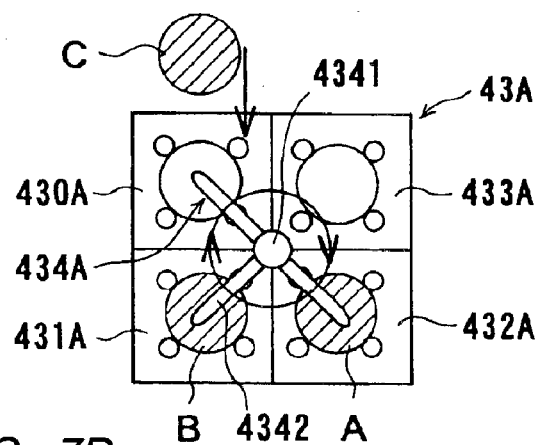
Figure 7D:
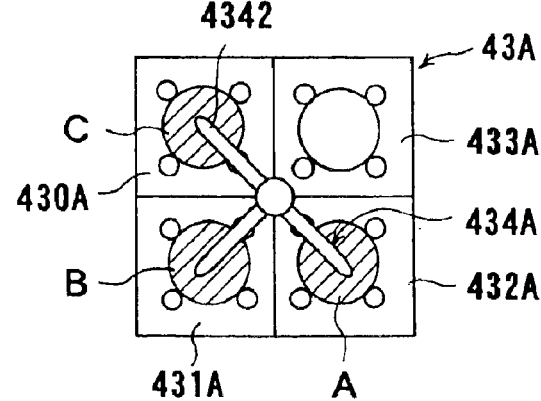

The reversing machine 430A turns the wafer B upside down, and the cleaned wafer A and the reversed wafer B are held by the holding mechanisms of the rotating arms 4342, respectively (see FIG. 7A). Then, the shaft 4341 of the transferring mechanism 434A is rotated to transfer the wafer B to the primary cleaning device 431A, where the wafer B is cleaned, and the wafer A to the secondary cleaning device 432A, where the wafer A is cleaned (see FIG. 7B). Thereafter, the rotating arm 4342 is returned to the original position, and the second transfer robot 44A transfers another polished wafer C to the reversing machine 430A (see FIG. 7C). The reversing machine 430A turns the wafer C upside down, and the cleaned wafers A, B and the reversed wafer C are held by the holding mechanisms of respective rotating arms 4342 (see FIG. 7D).

Figure 8A:
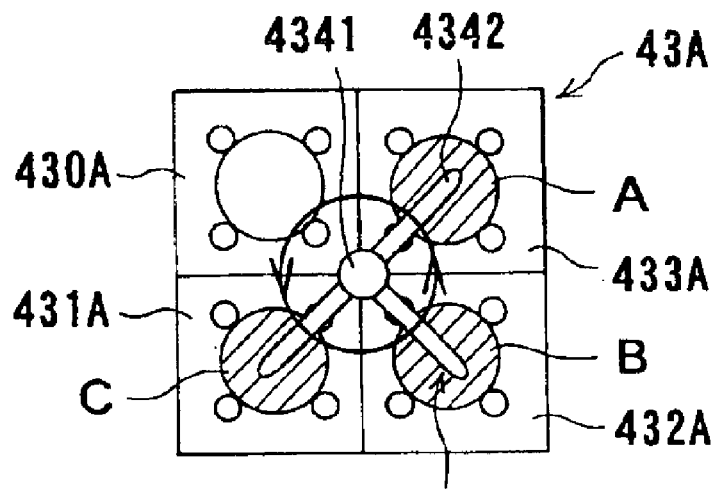
FIGS. 8A through 8C are schematic diagrams explanatory of a transferring process of the first cleaning unit shown in FIG. 3.
Figure 8B:
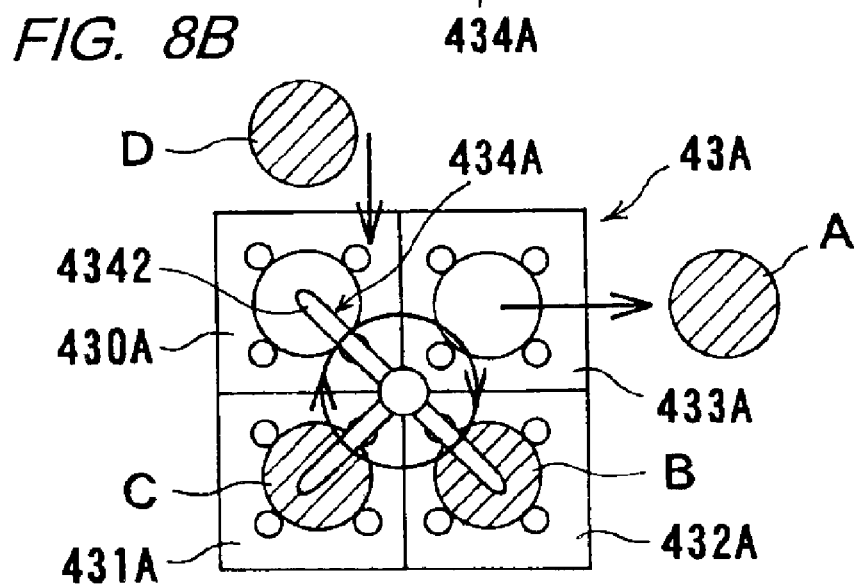
Figure 8C:
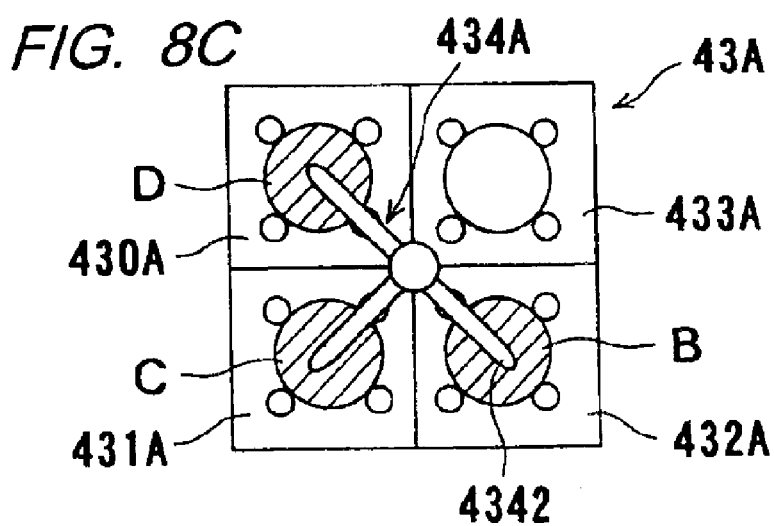

Then, the shaft 4341 of the transferring mechanism 434A is rotated to transfer the wafer C to the primary cleaning device 431A, where the wafer C is cleaned, the wafer B to the secondary cleaning device 432A, where the wafer B is cleaned, and the wafer A to the tertiary cleaning device 433A, where the wafer A is cleaned (see FIG. 8A). Thereafter, the rotating arm 4342 is returned to the original position, and the second transfer robot 44A transfers another polished wafer D to the reversing machine 430A (see FIG. 8B). At that time, the wafer A which has been cleaned and dried in the tertiary cleaning device 433A is delivered to the first transfer robot 42. The reversing machine 430A turns the wafer D upside down, and the cleaned wafers B, C and the reversed wafer D are held by the holding mechanisms of the rotating arms 4342, respectively (see FIG. 8C). Then, the processes described in connection with FIGS. 8A through 8C are repeated.

Thus, according to the present embodiment, semiconductor wafers can simultaneously be transferred from the reversing machine 430A to the primary cleaning device 431A, from the primary cleaning device 431A to the secondary cleaning device 432A, and from the secondary cleaning device 432A to the tertiary cleaning device 433A, respectively. Therefore, it is possible to reduce the time required for transferring wafers in the polishing apparatus.

The polishing units 30A, 30B, 30C, and 30D in the polishing section 3 will be described below. These polishing units 30A, 30B, 30C, and 30D have substantially the same structure. Although the following description relates only to the first polishing unit 30A, it can be applied to the other polishing units 30B, 30C, and 30D.

The polishing table 300A has a polishing pad or a grinding stone attached thereon. The polishing pad or the grinding stone forms a polishing surface to polish a semiconductor wafer. At the time of polishing, a polishing liquid is supplied onto the polishing surface of the polishing table 300A from the polishing liquid supply nozzle. A semiconductor wafer to be polished is pressed against the polishing surface by the top ring 301A. Thus, the semiconductor wafer is polished. One or more polishing units may have a polishing surface in the form of a belt or a tape. In such a case, a polishing surface in the form of a belt or a tape can be combined with a polishing surface in the form of a table.

Figure 9:
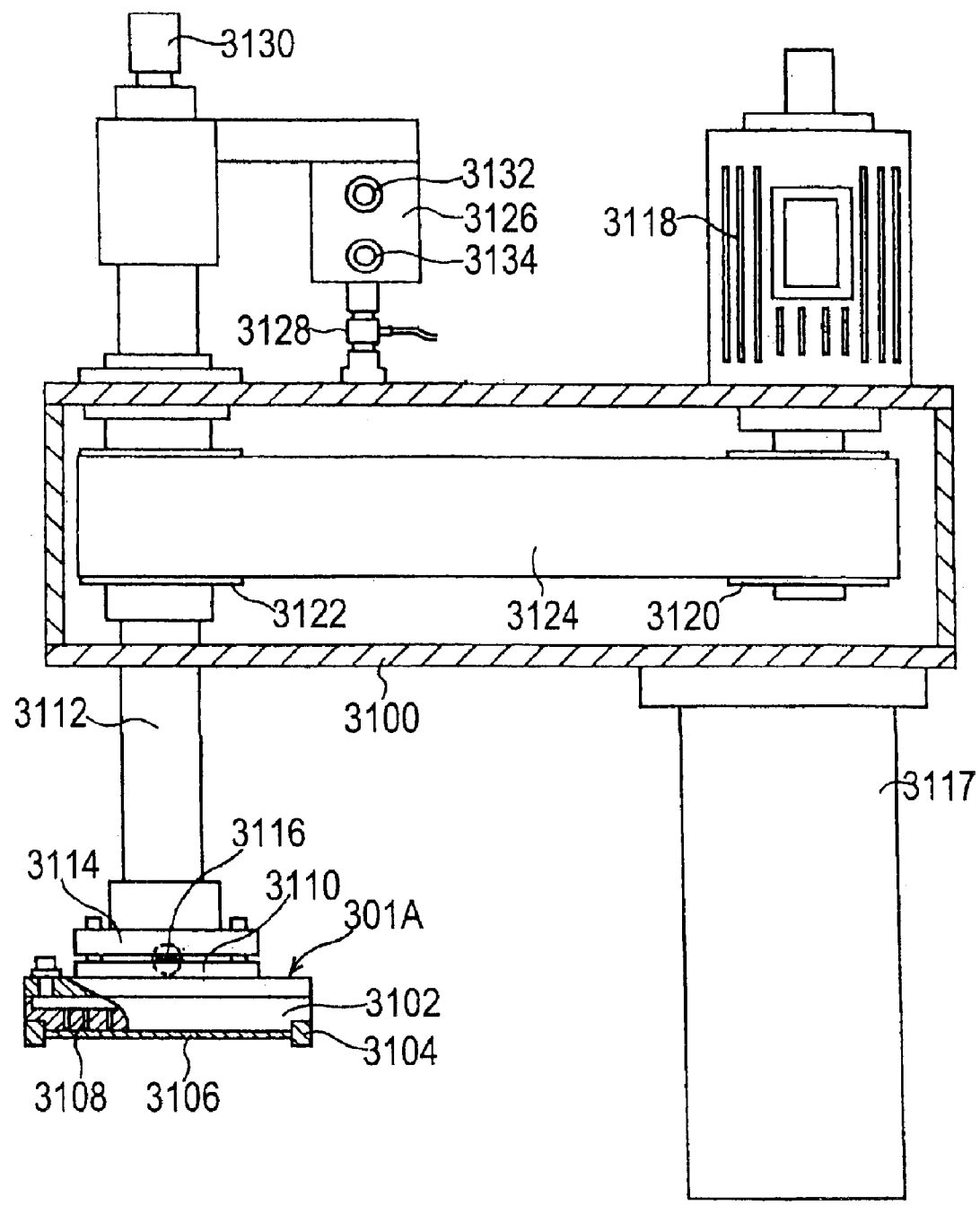
FIG. 9 is a side view, partly in cross-section, showing a structure of a top ring in the polishing apparatus shown in FIG. 1.

FIG. 9 is a side view, partly in cross-section, showing a structure of the top ring 301A in the first polishing unit 30A. The first polishing unit 30A has a top ring head 3100 for holding the top ring 301A so as to perform various motions including rotating, pressing, and swinging. As shown in FIG. 9, the top ring 301A has a top ring body 3102 for holding an upper surface of the wafer and pressing the wafer against the polishing surface of the polishing table 300A, a guide ring 3104 for retaining an outer periphery of the wafer, and a backing pad 3106 attached to the lower surface of the top ring body 3102 and having a cushioning function between the top ring 301A and the wafer. The top ring body 3102 is made of a material having rigidity, such as ceramics or metal having stiffness and corrosion resistance (e.g., stainless). The top ring body 3102 has a wafer holding surface which is formed to a flat finish surface so that the entire surface of the wafer can be pressed uniformly against the polishing surface. The wafer holding surface of the top ring body 3102 may have a slightly concave or convex surface depending on the type of the wafer to be polished.

The guide ring 3104 has an inner diameter slightly larger than the diameter of the wafer so that the wafer is inserted into the guide ring 3104 and retained by the guide ring 3104. The top ring body 3102 has a plurality of through-holes 3108 which extend from the wafer holding surface to a surface opposite to the wafer holding surface. Clean air or nitrogen gas having a positive pressure is supplied to the wafer held on the wafer holding surface through the through-holes 3108 to selectively and locally press certain areas of the wafer against the polishing surface. Further, a negative pressure is developed in the through-holes 3108 to attract the wafer under suction when the wafer is transported. Further, clean air or nitrogen gas can be ejected toward the wafer through the through-holes 3108 to remove the wafer from the top ring body 3102. In this case, pure water mixed with clean air or gas may be used to enhance a wafer removing force in order to reliably remove the wafer.

The top ring 301A has an attachment flange 3110 mounted on an upper surface thereof. The attachment flange 3110 has a hemispherical hole defined centrally in an upper surface thereof A drive flange 3114 fixed to a top ring drive shaft 3112 is disposed above the attachment flange 3110. The drive flange 3114 has a hemispherical hole defined in a lower surface thereof A hard ball 3116 made of, for example, ceramics is received in the hemispherical holes. A downward pressing force applied to the drive flange 3114 is transmitted via the ball 3116 to the attachment flange 3110.

The top ring head 3100 supports the top ring 301A through the top ring drive shaft 3112 comprising a spline shaft. The top ring head 3100 is supported by a support shaft 3117. The support shaft 3117 is rotated by a motor (not shown) coupled to the lower end of the support shaft 3117 to swing the top ring head 3100 by the rotation of the support shaft 3117. By the swinging motion of the top ring head 3100, the top ring 301A can be moved to a polishing position, a maintenance position, and a transfer position. A motor 3118 is provided above the support shaft 3117 and on the upper surface of the top ring head 3100. The motor 3118 rotates a driving pulley 3120 fixed to an end of a shaft of the motor 3118. A driven pulley 3122 fixed to the top ring drive shaft 3112 is rotated through a belt 3124. When the driven pulley 3122 is rotated, the top ring drive shaft 3112 is rotated. The rotation of the top ring drive shaft 3112 is transmitted to the top ring 301A, so that the top ring 301A is rotated.

Further, an air cylinder 3126 is fixed to the upper surface of the top ring head 3100 in a manner such that a shaft of the air cylinder 3126 extends downwardly. The top ring head 3100 and the shaft of the air cylinder 3126 are flexibly coupled to each other. By controlling air pressure supplied to the air cylinder 3126, a force to lift or lower the top ring drive shaft 3112, i.e., a force to lift or lower the top ring 301A, can be controlled. A tensile/compressive load cell 3128 is interposed in the junction between the air cylinder 3126 and the top ring head 3100 for measuring a vertical thrust force generated by the air cylinder 3126 fixed to the top ring head 3100. Since the thrust force is equal to the force to press a wafer, a feedback circuit may be formed using the measured thrust force for the purpose of controlling the force to press the wafer. The body of the air cylinder 3126 and the top ring drive shaft 3112, comprising a spline shaft, are coupled to each other such that the top ring drive shaft 3112 can be rotated. When the air cylinder 3126 is operated in a vertical direction, the top ring drive shaft 3112 is simultaneously operated in a vertical direction. The top ring drive shaft 3112 has a vertical through-hole defined therein, with a tube (not shown) disposed in the vertical through-hole. Since the top ring drive shaft 3112 and the top ring 301A are rotated, a rotary joint 3130 is mounted on the upper end of the tube. A gas such as $N_2$ or clean air and/or a liquid such as pure water is supplied via the rotary joint 3130 to the top ring body 3102. Alternatively, the top ring body 3102 may be evacuated via the rotary joint 3130. The air cylinder 3126 may be mounted directly to the spline shaft. In such a case, the load cell 3128 is mounted on the junction between the air cylinder 3126 and the spline shaft.

The top ring 301A having the above structure attracts the wafer, which has been transported to the pusher 31 (see FIG. 1) under vacuum, and holds the wafer in the guide ring 3104 of the top ring 301A. Thereafter, the top ring 301A is swung from the position above the pusher 31 to the polishing surface on the polishing table 300A. After the top ring 301A is moved to the position above the polishing table 300A, the top ring 301A is rotated at a predetermined rotational speed and then lowered by the air cylinder 3126 to bring the wafer into contact with the polishing surface on the polishing table 300A. When the top ring 301A is lowered to the upper surface of the polishing table 300A, a sensor 3132 for detecting the lower end of the stroke of the air cylinder 3126 is actuated to generate a signal indicating that the downward movement of the air cylinder 3126 is completed. In response to the signal, the air cylinder 3126 is supplied with air under a pressure corresponding to a desired pressing load to press the top ring 301A against the polishing table 300A to apply a pressing force to the wafer. At the same time, a vacuum line for developing a negative pressure to attract the wafer is cut off. At that time, depending on the type of layer to be polished on the wafer, a negative pressure may remain, or a valve may be operated to control the pressure of the gas to apply a positive pressure to the upper surface of the wafer to control the polished profile of the wafer. The pressure developed at that time is applied only to the through-holes 3108 defined in the wafer holding surface of the top ring body 3102. Therefore, depending on the areas of the wafer to which the pressure is to be applied, the diameters, number, and positions of the through-holes 3108 are varied to achieve a desired polished profile.

After a desired polishing process is completed, the top ring 301A attracts the wafer under suction. The completion of a polishing process is controlled based on a period of time or a film thickness. The wafer held by the top ring 301A is moved toward an outer periphery of the polishing table 300A while the wafer is held in contact with the polishing pad on the polishing table 300A. Finally, the wafer W projects from the outer periphery of the polishing table 300A in a manner such that the center of the wafer is still located on the polishing table 300A but near the periphery of the polishing table 300A as much as possible. Thus, about 40% of the surface of the wafer projects from the polishing table 300A. Thereafter, the air cylinder 3126 is actuated to lift the top ring 301A holding the wafer W. Depending on the polishing pad which is used, a surface tension between slurry on the polishing pad and the wafer may be stronger than the attractive force of the top ring. In such a case, the wafer tends to be left on the polishing pad when it is lifted from the polishing pad. In order to reduce the surface tension between the slurry on the polishing pad and the wafer, the wafer is allowed to project from the polishing table, and then the top ring 301A is lifted. If more than 40% of the surface area of the wafer projects from the polishing table, then the top ring would be tilted to cause the wafer to hit the edge of the polishing table 300A and be cracked. Therefore, it is desirable that about 40% of a surface area of the wafer projects from the polishing table. The center of the wafer should be located on the polishing table 300A.

When lifting of the top ring 301A is completed, a sensor 3134 detects the completion of the lifting action of the air cylinder 3126. Thereafter, the top ring 301A starts a swinging motion. The top ring 301A moves to a position above the pusher 31 and transfers the wafer to the pusher 31. After the wafer is removed from the top ring 301A, a cleaning liquid is ejected upwardly, horizontally, or downwardly toward the top ring 301A from one or more nozzles. Thus, the wafer holding surface of the top ring 301A, the wafer, and surrounding regions are cleaned. The supply of the cleaning liquid may be continued until the next wafer is transferred to the top ring 301A to prevent the top ring from being dried. The cleaning liquid may be intermittently ejected to reduce the running cost. While the wafer is being polished, the polishing time may be divided into a plurality of steps, and the pressing force and rotational speed of the top ring and the method of holding the wafer may be changed in each of the steps. It is also possible to change the kind, amount, density, and temperature of the used polishing liquid, and the timing of supplying the polishing liquid.

If the current supplied to the motor for rotating the top ring is monitored during the polishing process, then the torque outputted by the motor can be calculated based on the monitored current. When the polishing of a wafer reaches an end point, the friction between the wafer and the polishing pad is changed. Therefore, an end point of the polishing of the wafer may be detected based on a change in the torque of the motor. Similarly, the current supplied to the motor for rotating the polishing table 300A may be monitored, and a change in the torque may be calculated based on the monitored current to detect an end point of the polishing of the wafer. While a wafer is polished, vibrations of the top ring are measured to detect an end point of the polishing of the wafer based on detected inflection points of the vibration waveform. Furthermore, an electrostatic capacitance may be measured to detect an end point of the polishing process. These four types of detection methods are based on differences between surface irregularities or surface qualities before and after polishing, or on the thickness of the remaining film. After the surface of a polished wafer is cleaned, the polishing amount may be measured to determine if the polishing is insufficient. In the case of insufficient polishing, the wafer may be polished again.

Figure 10:
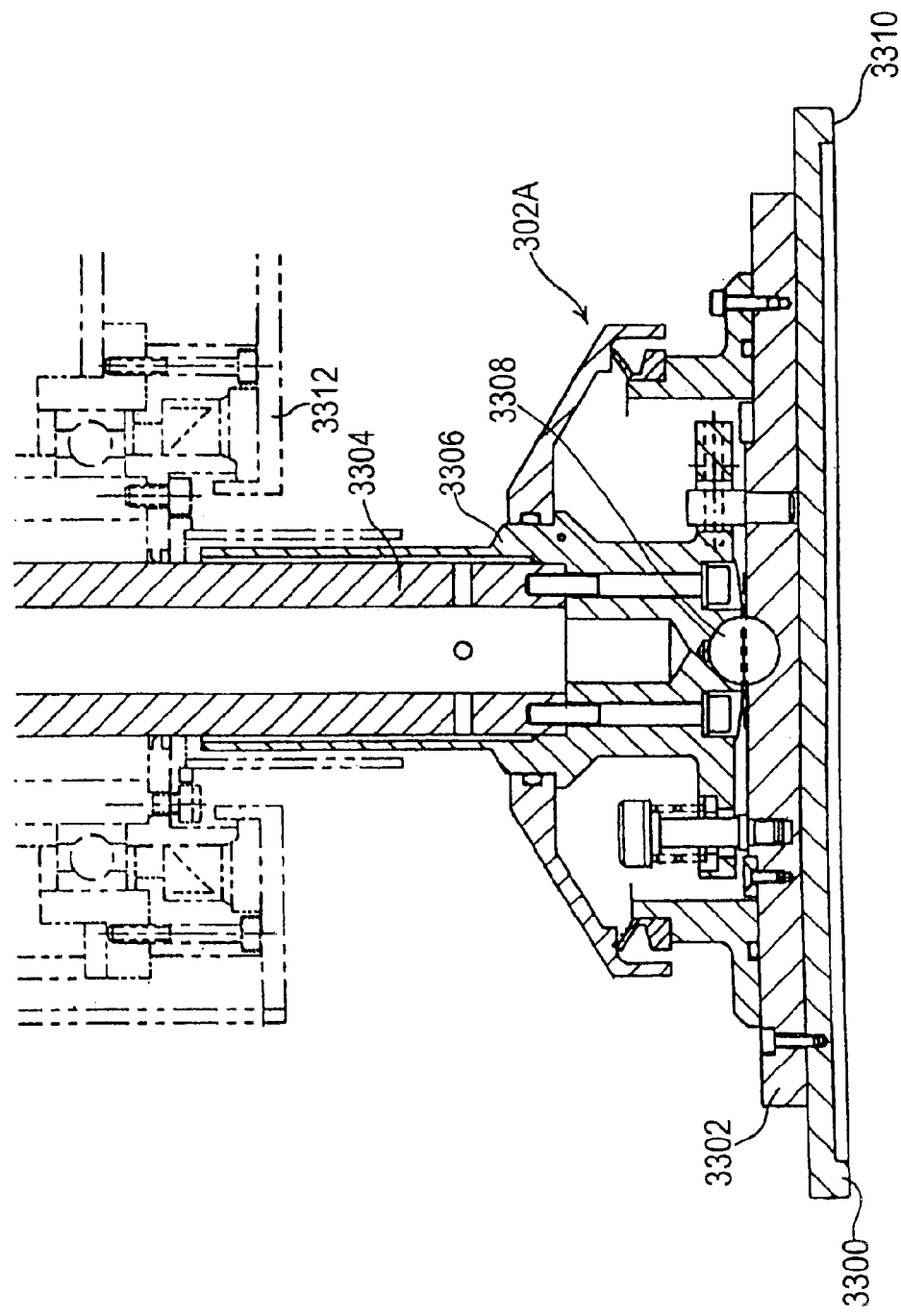
FIG. 10 is a vertical cross-sectional view showing a diamond dresser as a dresser in the polishing apparatus shown in FIG. 1.
Figure 11:
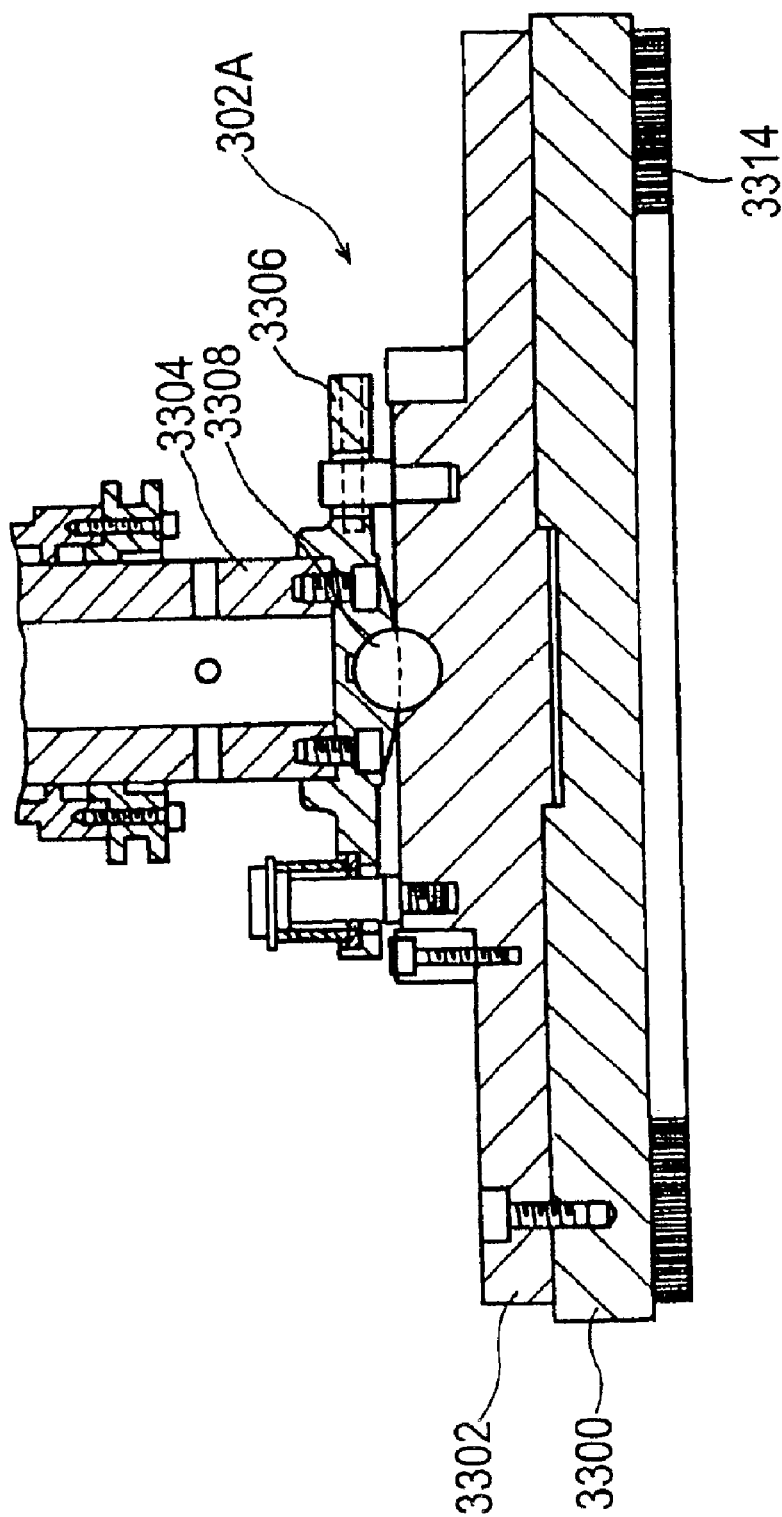
FIG. 11 is a vertical cross-sectional view showing a brush dresser as a dresser in the polishing apparatus shown in FIG. 1.

FIGS. 10 and 11 are vertical cross-sectional views showing examples of the dresser 302A. FIG. 10 shows a diamond dresser, and FIG. 11 shows a brush dresser. As shown in FIG. 10, the dresser 302A has a dresser plate 3300 having a dressing surface for dressing the polishing pad. The dresser plate 3300 is fastened to an attachment flange 3302 having a hemispherical hole defined centrally in an upper surface thereof. A drive flange 3306 fixed to a dresser drive shaft 3304 is disposed above the attachment flange 3302. The drive flange 3306 has a hemispherical hole defined in a lower surface thereof. A hard ball 3308 made of, for example, ceramics is received in the hemispherical holes. A downward pressing force applied to the drive flange 3306 is transmitted via the ball 3308 to the dresser plate 3300.

Diamond particles 3310 for conditioning the shape of the polishing pad and dressing the polishing pad are electrodeposited on a lower surface of the dresser plate 3300. Alternatively, a number of hard protrusions of, for example, ceramics may be provided on the dresser plate 3300. The diamond particles or hard protrusions can be replaced merely by replacing the dresser plate 3300 so as to readily perform other types of dressing processes. In either case, because the surface configuration of the dresser plate 3300 reflects the surface configuration of the polishing pad to be dressed, the dressing surface of the dresser is finished to a flat surface.

The dresser drive shaft 3304 is supported on a dresser head 3312. The dresser head 3312 has essentially the same function as the top ring head 3100. The dresser drive shaft 3304 is rotated by a motor and vertically moved by an air cylinder. The details of the structure of the dresser head 3312 are substantially the same as those of the top ring head 3100, and are thus not further illustrated or described.

FIG. 11 shows a brush dresser having a brush 3314 mounted on the lower surface of a dresser plate 3300. Other structural details of the brush dresser are substantially the same as those of the diamond dresser shown in FIG. 10.

When the shape of the polishing pad is conditioned or the polishing pad is dressed, the dresser 302A is swung from a cleaning position to a dressing position on the polishing table 300A. After the swing motion is completed, the dresser 302A is rotated at a predetermined rotational speed and lowered by the air cylinder. When the dresser 302A is brought into contact with the upper surface of the polishing table 300A, a sensor associated with the air cylinder detects the lower end of its stroke to generate a signal indicating that the dresser 302A has touched the polishing table 300A. In response to the signal, the air cylinder applies a pressing force to the dresser 302A to dress the polishing pad on the polishing table 300A under a desired pressing force. After the dresser 302A has dressed the polishing pad for a desired period of time, the air cylinder is operated to lift the dresser 302A away from the polishing table 300A. Thereafter, the dresser 302A is swung to the cleaning position, where the dresser 302A is submerged in a water container (not shown) and cleaned, for example. The dresser may be cleaned by being submerged in the water tank, by ejecting a spray from a spray nozzle, or by being rotated and pressed against a brush provided on the bottom of the water tank. An ultrasonic element may be provided in the water tank to clean the dresser by the vibrational energy of the ultrasonic element.

Further, the first polishing unit 30A has an atomizer as a non-contact type dresser using a fluid pressure in addition to the mechanical dresser 302A. The atomizer mainly serves to wash away polishing wastes and slurry particles which have been accumulated on or clogged in the polishing surface. A combination of the cleaning of the polishing surface by the atomizer using a fluid pressure and the dressing of the polishing surface by the dresser 302A using a mechanical contact can achieve more effective dressing, i.e., can regenerate the polishing surface more effectively. The conditioning of the polishing surface by an atomizer is usually performed after dressing by a contact type dresser such as a diamond dresser.

The linear transporter 5 in the polishing section 3 will be described below. As shown in FIG. 1, the linear transporter 5 has six transfer stages TS1, TS2, TS3, TS4, TS5, and TS6, which are linearly movable in a reciprocating manner. These transfer stages have a two-line structure including an upper line and a lower line. Specifically, a first transfer stage TS1, a second transfer stage TS2, a third transfer stage TS3, and a fourth transfer stage TS4 are disposed on an upper line, whereas a fifth transfer stage TS5 and a sixth transfer stage TS6 are disposed on a lower line.

Figure 12:
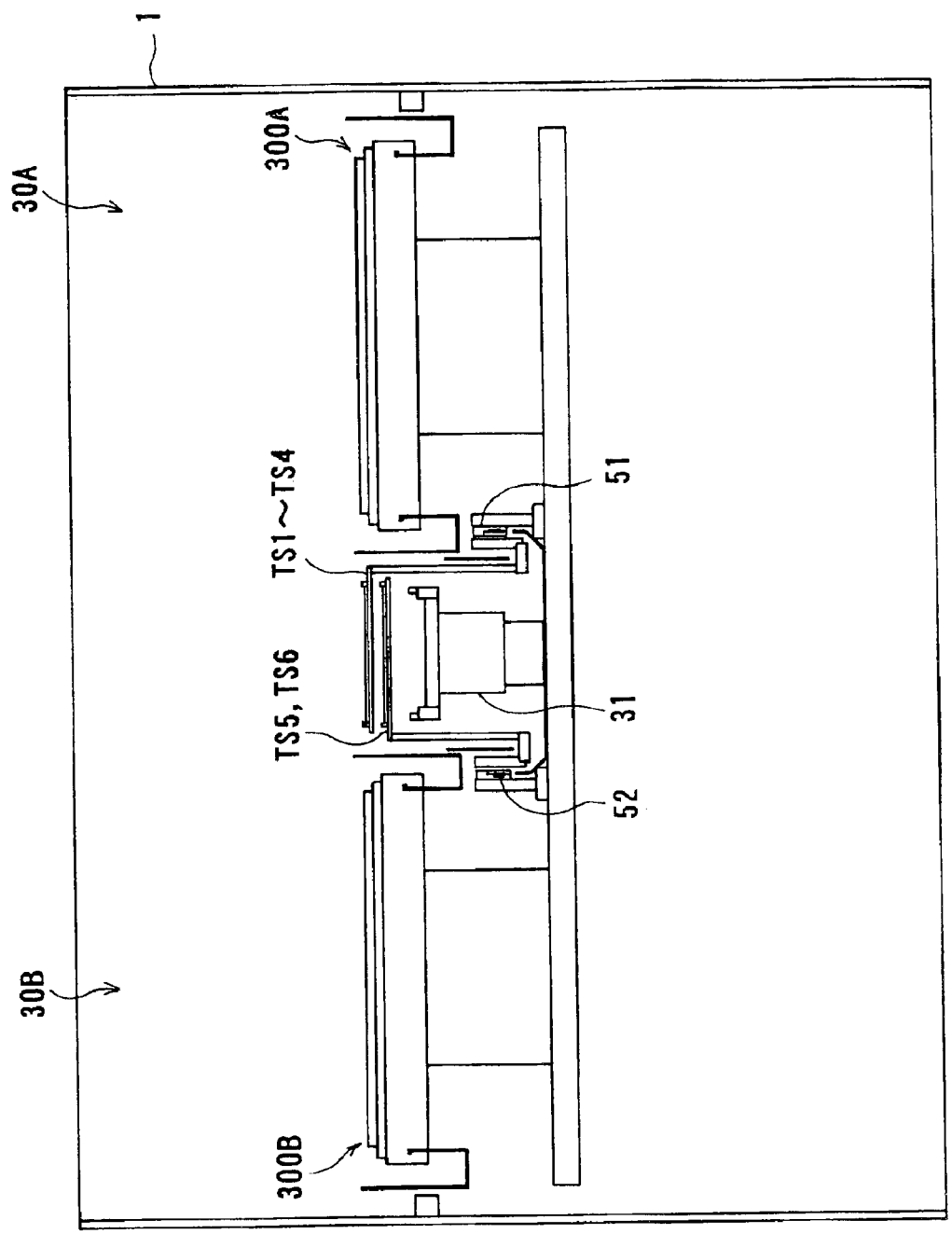
FIG. 12 is a cross-sectional view taken along a line A—A of FIG. 1.

FIG. 12 is a cross-sectional view taken along a line A—A of FIG. 1, except that the lower transfer stages TS5 and TS6 are disposed on the polishing section 3 as viewed from the A—A line. While the upper transfer stages TS1, TS2, TS3, and TS4 and the lower transfer stages TS5 and TS6 move on the same axis in the plan view shown in FIG. 1, the upper transfer stages TS1, TS2, TS3, and TS4 and the lower transfer stages TS5 and TS6 can freely move without interfering with each other because they are provided at different heights.

The transfer stage TS1 transfers a wafer between the transferring position TP1, the transferring position TP2, and the transferring position TP3, which is a wafer receiving/delivering position at which the pusher 31 is disposed. The transfer stage TS2 transfers a wafer between the transferring position TP2, the transferring position TP3, and the transferring position TP4, which is a wafer receiving/delivering position at which the pusher 32 is disposed. The transfer stage TS3 transfers a wafer between the transferring position TP3, the transferring position TP4, and the transferring position TP5, which is a wafer receiving/delivering position at which the pusher 33 is disposed. The transfer stage TS4 transfers a wafer between the transferring position TP4, the transferring position TP5, and the transferring position TP6, which is a wafer receiving/delivering position at which the pusher 34 is disposed. These upper transfer stages TS1, TS2, TS3, and TS4 serve to introduce wafers into the polishing section 3 and to transfer the wafers between the respective polishing units.

The transfer stage TS5 transfers a wafer between the transferring position TP1 and the transferring position TP5, and the transfer stage TS6 transfers a wafer between the transferring position TP2 and the transferring position TP6. These lower transfer stages TS5 and TS6 serve to transfer wafers which have been polished.

The upper transfer stages TS1, TS2, TS3, and TS4 are integrally formed with each other. The transfer stages TS1, TS2, TS3, and TS4 are linearly moved together with each other in a reciprocating manner by actuation of a rodless cylinder 51 as shown in FIG. 12. Similarly, the lower transfer stages TS5 and TS6 are integrally formed with each other. The transfer stages TS5 and TS6 are linearly moved together with each other in a reciprocating manner by actuation of a rodless cylinder 52. In the present embodiment, the transfer stages are moved by the rodless cylinders 51 and 52. However, the transfer stages may be moved by actuation of motors and ball screws coupled to the motors.

The pushers 31 to 34 in the polishing section 3 will be described below. The pusher 31 serves to receive a wafer from the transfer stage TS1 of the linear transporter 5 and deliver the wafer to the top ring 301A of the first polishing unit 30A, and also serves to receive a polished wafer from the first polishing unit 30A and deliver the wafer to the transfer stage TS2 or TS3 of the linear transporter 5. The pusher 32 serves to receive a wafer from the transfer stage TS2 of the linear transporter 5 and deliver the wafer to the top ring 301B of the second polishing unit 30B, and also serves to receive a polished wafer from the second polishing unit 30B and deliver the wafer to the transfer stage TS3 or TS4 of the linear transporter 5. The pusher 33 serves to receive a wafer from the transfer stage TS3 of the linear transporter 5 and deliver the wafer to the top ring 301C of the third polishing unit 30C, and also serves to receive a polished wafer from the third polishing unit 30C and deliver the wafer to the transfer stage TS4 or TS5 of the linear transporter 5. The pusher 34 serves to receive a wafer from the transfer stage TS4 of the linear transporter 5 and deliver the wafer to the top ring 301D of the fourth polishing unit 30D, and also serves to receive a polished wafer from the fourth polishing unit 30D and deliver the wafer to the transfer stage TS6 of the linear transporter 5. Thus, the pushers 31 to 34 serve as a receiving/delivering mechanism for receiving and delivering wafers between the linear transporter 5 and the respective top rings. The pushers 31 to 34 have the same structure, and hence only the pusher 31 will be described below.

Figure 13:
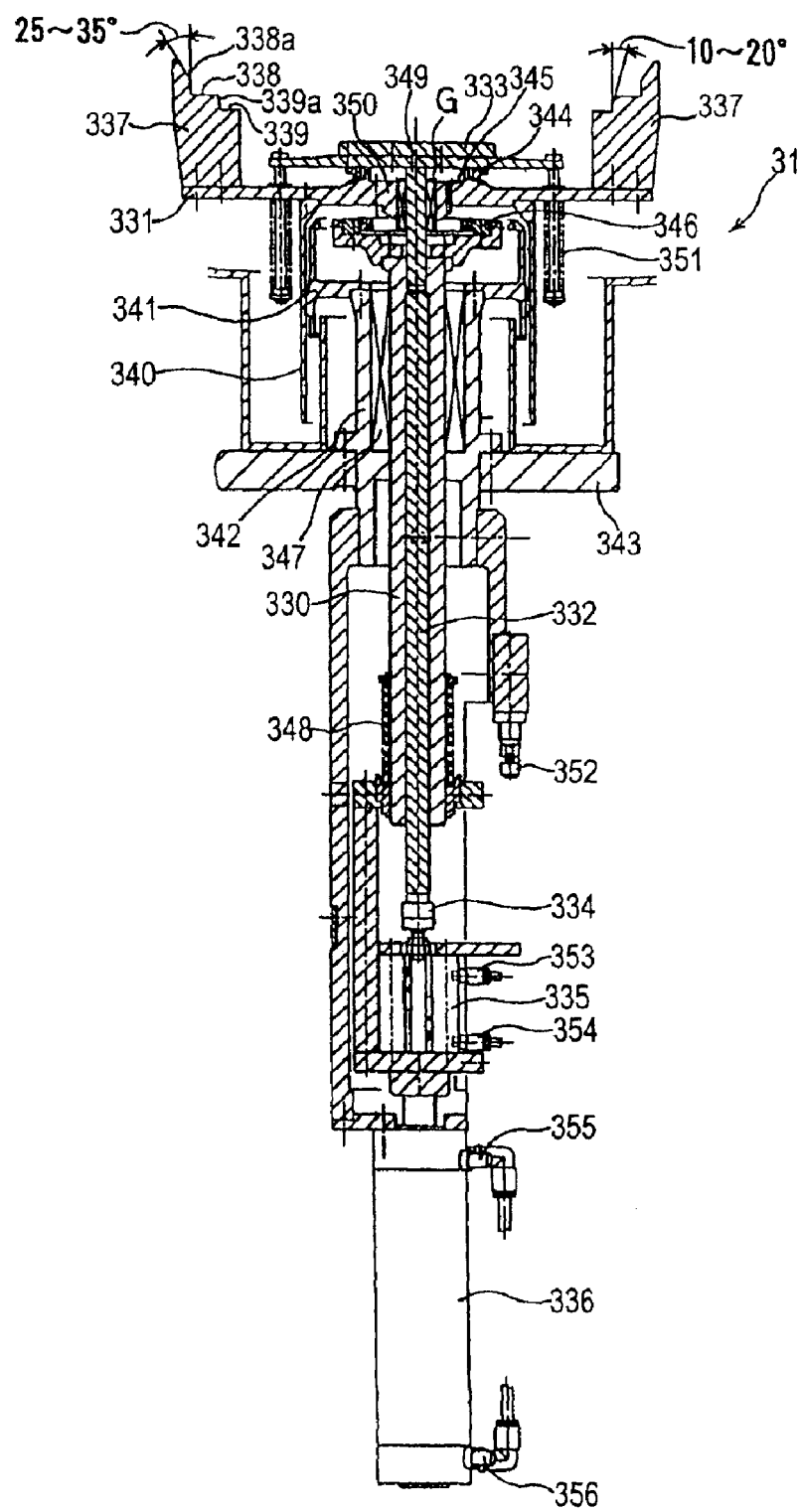
FIG. 13 is a vertical cross-sectional view showing a pusher in the polishing apparatus shown in FIG. 1.

FIG. 13 is a vertical cross-sectional view showing the pusher 31. As shown in FIG. 13, the pusher 31 has a hollow shaft 330, a guide stage 331 provided above the hollow shaft 330 for holding the top ring, a spline shaft 332 extending through the hollow shaft 330, and a push stage 333 provided above the spline shaft 332 for holding a wafer thereon. The pusher 31 also has air cylinders 335, 336 coupled to the spline shaft 332 through a flexible joint 334. These two air cylinders 335 and 336 are disposed vertically in series. The lower air cylinder 336 serves to lift and lower the guide stage 331 and the push stage 333. The lower air cylinder 336 lifts and lowers the hollow shaft 330 together with the upper air cylinder 335. The upper air cylinder 335 serves to lift and lower the push stage 333.

The pusher 31 has four top ring guides 337 provided at an outer circumferential portion of the guide stage 331. Each of the top ring guides 337 has a two-stage structure including an upper stage 338 and a lower stage 339. The upper stage 338 of the top ring guides 337 serves as a contact portion with a lower surface of the guide ring 3104 (see FIG. 9) of the top ring, whereas the lower stage 339 serves as a centering portion for centering a wafer and a support portion for supporting the wafer. The upper stage 338 has a tapered surface 338a formed for guiding the guide ring 3104 toward the upper stage 338. The tapered surface 338a should preferably have an angle of about 25° to about 35° from the perpendicular. The lower stage 339 has a tapered surface 339a formed for guiding the wafer W toward the lower stage 339. The tapered surface 339a should preferably have an angle of about 10° to about 20° from the perpendicular. When the wafer is unloaded from the top ring 301A, the top ring guides 337 receive the peripheral edge of the wafer.

The pusher 31 has a guide sleeve 340 provided below the guide stage 331. The guide sleeve 340 has a function for preventing water from entering a central portion of the guide stage 331, and a function for guiding the guide stage 331 so that the guide stage 331 is returned to its original position. The pusher 31 has a center sleeve 341 located inside of the guide sleeve 340 for centering the guide stage 331. The center sleeve 341 is fixed to a bearing case 342. The pusher is connected through the bearing case 342 to a motor housing 343 in the polishing section 3.

A V-ring 344 is used to prevent water from entering between the push stage 333 and the guide stage 331. The V-ring 344 has a lip held in contact with the guide stage 331 to prevent water from passing therethrough. When the push stage 333 is lifted, the volume of a portion G is increased to lower the pressure in the portion G. Therefore, water may be drawn into the portion G. In order to prevent water from being drawn into the portion G the guide stage 331 has a hole 345 defined in an inner side of the V-ring 344 for preventing the pressure in the portion G from being lowered.

The pusher 31 has a linear way 346 movable in directions of an X-axis and a Y-axis for allowing the top ring guide 337 to have an alignment mechanism. The guide stage 331 is fixed to the linear way 346, and the linear way 346 is fixed to the hollow shaft 330. The hollow shaft 330 is held through a slide bush 347 by the bearing case 342. The stroke of the air cylinder 336 is transmitted through a compression spring 348 to the hollow shaft 330.

The push stage 333 is located above the guide stage 331. The push stage 333 has a push rod 349 extending downwardly from the center of the push stage 333. The push rod 349 passes through a slide bush 350 located at the center of the guide stage 331 so that the push rod 349 is centered. The push rod 349 is connected to an upper end of the spline shaft 332. The push stage 333 is vertically moved by the spline shaft 332 with the air cylinder 335 so that the wafer W is loaded on the top ring 301A. The push stage 333 has compression springs 351 provided at a peripheral portion thereof for positioning the push stage 333.

The pusher 31 has a shock absorber 352 for positioning the top ring guides 337 in a vertical direction and for shock-absorbing when the top ring guides 337 contact the top ring 301A. Each of the air cylinders 335 and 336 has upper and lower limit sensors for detecting a position of the pusher in a vertical direction. Specifically, the upper air cylinder 335 has sensors 353 and 354, and the lower air cylinder 336 has sensors 355 and 356. The pusher 31 has one or more cleaning nozzles (not shown) for cleaning the pusher 31 so as to prevent the slurry attached to the pusher 31 from contaminating the wafer. The pusher 31 may have a sensor for detecting the presence of a wafer positioned on the pusher 31. The air cylinders 335 and 336 are controlled by double solenoid valves, respectively.

Operation of the pusher 31 thus constructed will be described below. FIGS. 14A through 14E are cross-sectional views explanatory of operation of the pusher 31.

1) Loading a Wafer

Figure 14:
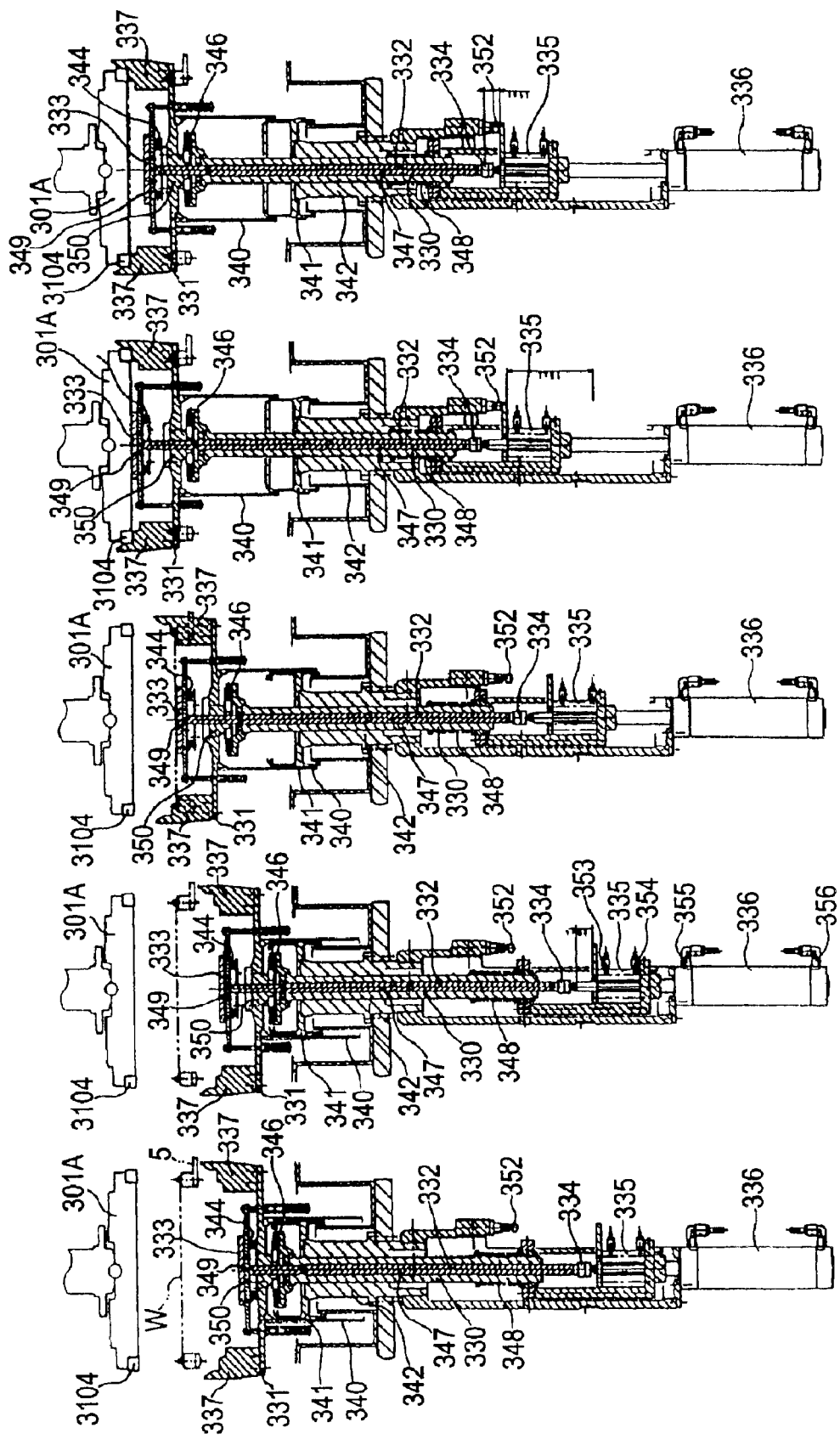
FIGS. 14A through 14E are vertical cross-sectional views explanatory of operation of the pusher shown in FIG. 13.

As shown in FIG. 14A, a wafer W is transferred to a position above the pusher 31 by the linear transporter 5. When the top ring 301A is located at a loading position (i.e., the third transferring position TP3) above the pusher 31 and does not hold the wafer, the push stage 333 is lifted by the air cylinder 335, as shown in FIG. 14B. When the sensor 353 detects the completion of lifting the push stage 333, the guide stage 331 and the components associated with the guide stage 331 are lifted by the air cylinder 336, as shown in FIG. 14C. While the guide stage 331 is lifted, the guide stage 331 passes through the wafer holding position of the linear transporter 5. At that time, the wafer W is centered by the tapered surfaces 339a of the top ring guides 337 and held by the push stage 333 at portions other than the peripheral edge thereof (pattern surface).

While the push stage 333 holds the wafer W, the top ring guides 337 are lifted without being stopped, and the guide ring 3104 is guided by the tapered surfaces 338a of the top ring guides 337. The center of the top ring guides 337 is aligned with the center of the top ring 301A by the linear way 346 movable in X and Y directions, and the upper stages 338 of the top ring guides 337 contact the lower surface of the guide ring 3104 and lifting of the guide stage 331 is stopped.

When the upper stages 338 of the top ring guides 337 are brought into contact with the lower surface of the guide ring 3104, the guide stage 331 is fixed and is not lifted anymore. However, the air cylinder 336 continues the lifting motion until a stopper fixed to a rod of the air cylinder 336 is brought into contact with the shock absorber 352. Accordingly, only the spline shaft 332 continues to be lifted because the compression spring 348 is compressed, and the push stage 333 is further lifted. At that time, as shown in FIG. 14D, the push stage 333 holds the wafer W at portions other than the peripheral edge of the wafer W, and transports the wafer W to the top ring 301A. After the wafer W is brought into contact with the top ring 301A, the lifting stroke of the air cylinder 336 is absorbed by the compression springs 351 to thereby protect the wafer W.

After the top ring 301A completes the attraction of the wafer W, the pusher 31 starts to be operated and the guide stage 331 and the push stage 333 are lowered to the position shown in FIG. 14A. When the guide stage 331 is lowered, the guide stage 331 is centered by a taper portion formed on the guide sleeve 340 and the taper portion formed on the center sleeve 341. When the lowering of the guide stage 331 is completed, the operation of the loading of the wafer is completed.

2) Unloading a Wafer

The wafer W is transported by the top ring 301A to a wafer unloading position located above the pusher 31. When the transfer stage of the linear transporter 5 is located above the pusher 31 and does not hold the wafer, the guide stage 331 and the components associated with the guide stage 331 are lifted by the air cylinder 336, and the guide ring 3104 of the top ring 301A is guided by the tapered surfaces 338a of the top ring guides 337. The center of the top ring guides 337 is aligned with the center of the top ring 301A by the linear way 346, and the upper stages 338 of the top ring guides 337 are brought into contact with the lower surface of the guide ring 3104 and the lifting of the guide stage 331 is stopped.

The air cylinder 336 continues to be actuated until the stopper fixed to the rod of the air cylinder 336 contacts the shock absorber 352. However, since the upper stages 338 of the top ring guides 337 contact the lower surface of the guide ring 3104 to cause the guide stage 331 to be fixed at this position, the air cylinder 336 pushes the spline shaft 332 together with the air cylinder 335 against urging force of the compression spring 348, thus lifting the push stage 333. At this time, as shown in FIG. 14E, the push stage 333 is not raised to a position higher than the wafer holding portion of the lower stages 339 of the top ring guides 337. In this embodiment, the air cylinder 336 is arranged to be further actuated after the top ring guides 337 contact the guide ring 3104. The shock at this time is absorbed by the spring 342.

After the lifting actuation of the air cylinder 336 is completed, the wafer W is removed from the top ring 301A. At this time, the wafer W is centered by the lower tapered surfaces 339a of the top ring guides 337, and the wafer W is held by the lower stages 339 of the top ring guides 337 at the peripheral edge of the wafer W. After the wafer W is held by the pusher 31, the pusher 31 starts to be operated to lower the guide stage 331. While the guide stage 331 is lowered, the guide stage 331 is centered by the guide sleeve 340 and the center sleeve 341. While the guide stage 331 is lowered, the wafer W is transferred from the pusher 31 to the linear transporter 5. When the lowering of the guide stage 331 is completed, the operation of the unloading of the wafer is completed.

Operation of polishing wafers with use of the aforementioned polishing apparatus will be described below. The polishing apparatus according to the present embodiment has a controller (not shown) for operating the linear transporter 5. The controller enables the linear transporter 5 to selectively perform one of serial processing and parallel processing.

Figure 15:
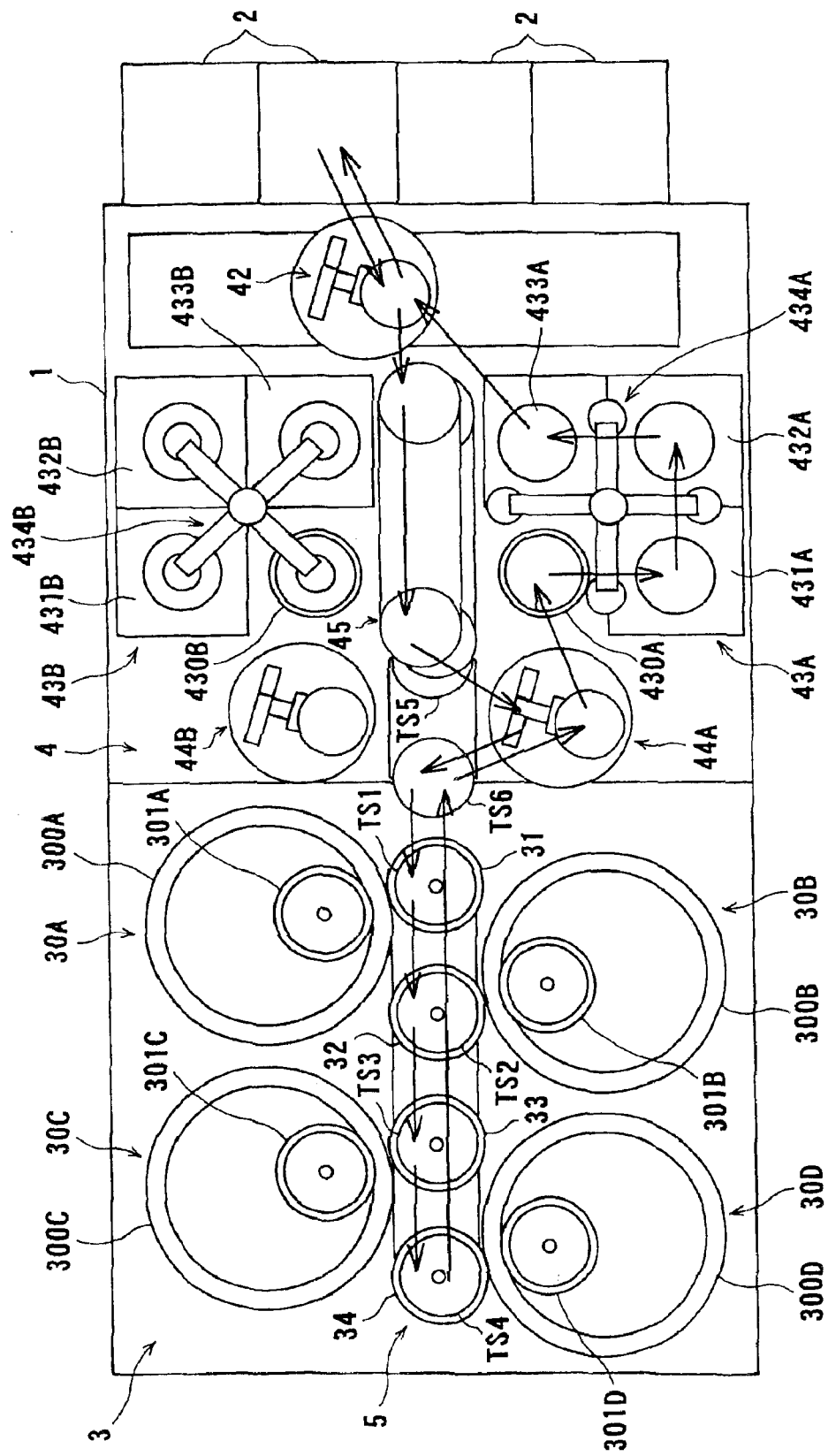
FIG. 15 is a plan view showing an example of movement of a wafer when serial processing is performed.

FIG. 15 shows an example of movement of a wafer when serial processing is performed. When serial processing is performed, as shown in FIG. 15, a wafer is processed on the following route: the wafer cassette of the loading/unloading stage 2→the first transfer robot 42 (reversed)→the linear transporter 45→the second transfer robot 44A→the transfer stage TS1 of the linear transporter 5→the pusher 31→the top ring 301A→the polishing table 300A→the pusher 31→the transfer stage TS2 of the linear transporter 5→the pusher 32→the top ring 301B→the polishing table 300B→the pusher 32→the transfer stage TS3 of the linear transporter 5→the pusher 33→the top ring 301C→the polishing table 300C→the pusher 33→the transfer stage TS4 of the linear transporter 5→the pusher 34 the top ring 301D the polishing table 300D→the pusher 34→the transfer stage TS6 of the linear transporter 5→the second transfer robot 44A→the reversing machine 430A of the first cleaning unit 43A→the transferring mechanism 434A→the primary cleaning device 431A→the transferring mechanism 434A→the secondary cleaning device 432A→the transferring mechanism 434A→the tertiary cleaning device 433A→the first transfer robot 42→the wafer cassette of the loading/unloading stage 2.

Operation of the linear transporter 5 in the polishing section 3 will be described below with reference to FIGS. 16A through 24C.

Figure 16A:
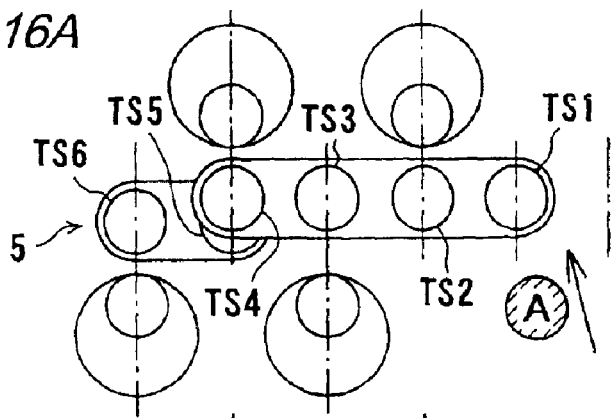
FIGS. 16A through 16D are schematic diagrams explanatory of operation of a linear transporter in a polishing section shown in FIG. 1 when serial processing is performed.
Figure 16B:
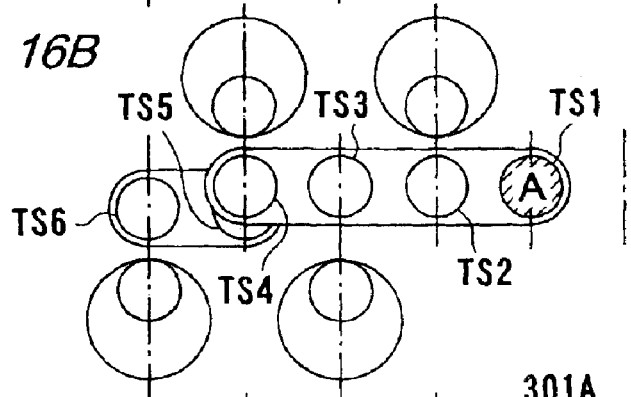
Figure 16C:
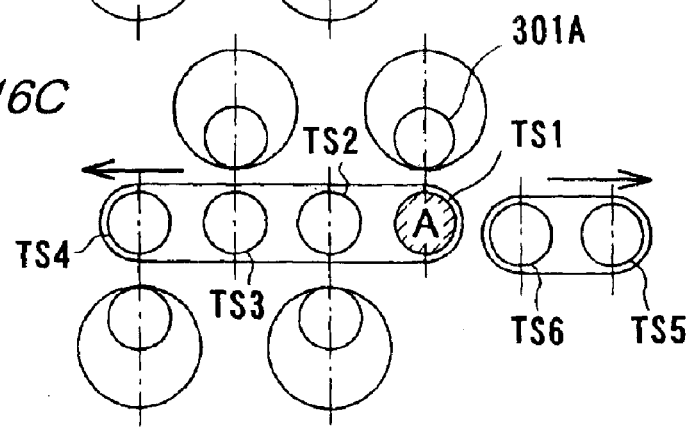
Figure 16D:
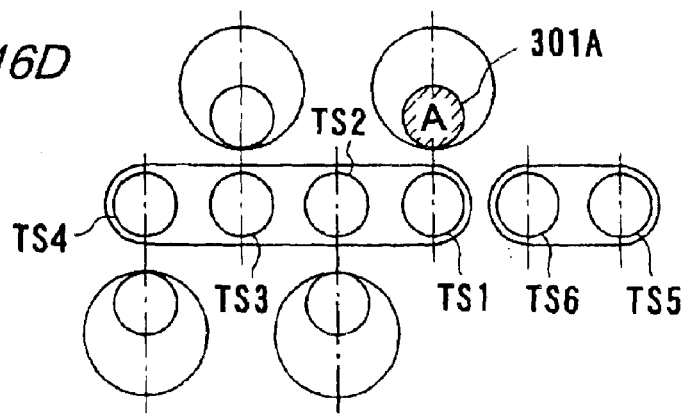

First, the second transfer robot 44A places a wafer A on the transfer stage TS1 which is located on the transferring position TP2 in the linear transporter 5 (see FIGS. 16A and 16B). The upper transfer stages TS1, TS2, TS3, and TS4 move toward the transferring position TP6, and the lower transfer stages TS5 and TS6 move toward the transferring position TP1. Thus, the wafer A on the transfer stage TS1 is moved to the wafer receiving/delivering position (transferring position TP3) for the top ring 301A (see FIG. 16C). Then, the pusher 31 located at the transferring position TP3 is lifted to transfer the wafer A from the transfer stage TS1 of the linear transporter 5 to the top ring 301A (see FIG. 16D).

Figure 17A:
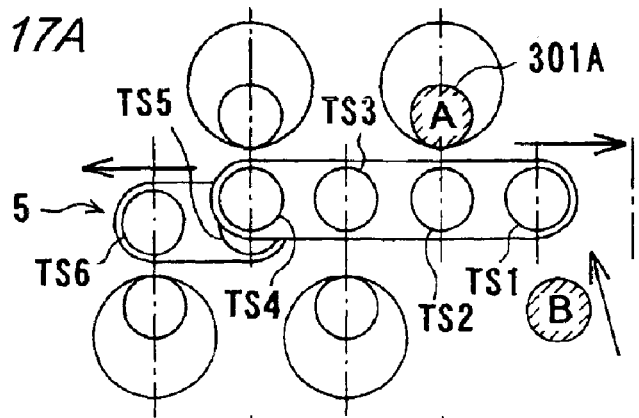
FIGS. 17A through 17D are schematic diagrams explanatory of operation of the linear transporter in the polishing section shown in FIG. 1 when serial processing is performed.
Figure 17B:
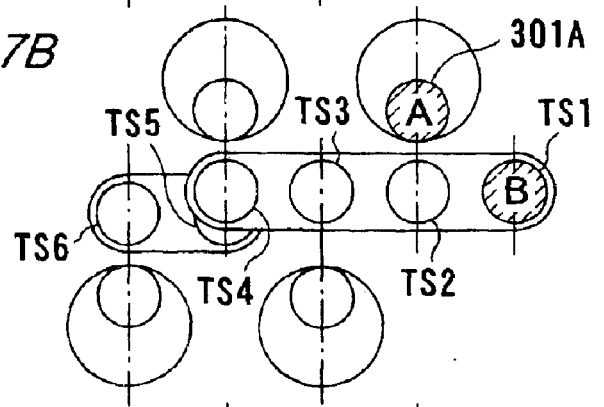
Figure 17C:
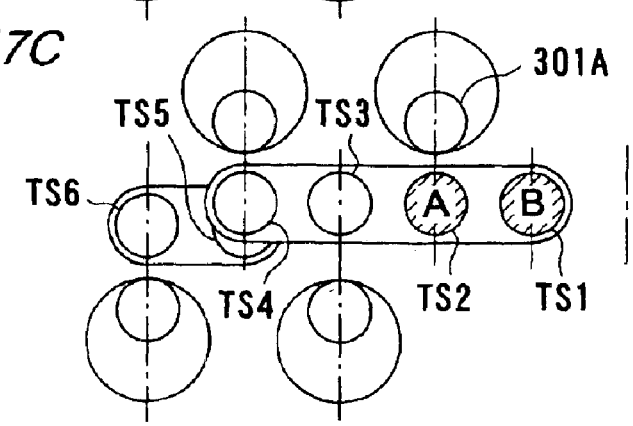
Figure 17D:
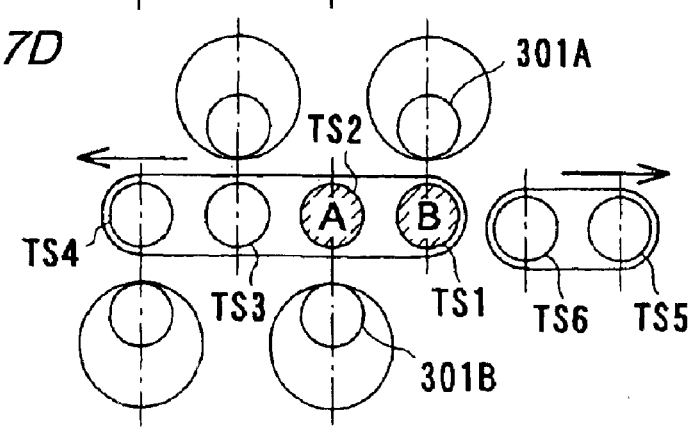

Next, the upper transfer stages TS1, TS2, TS3, and TS4 move toward the transferring position TP1, and the lower transfer stages TS5 and TS6 move toward the transferring position TP6 (see FIG. 17A). At that time, the second transfer robot 44A places another wafer B on the transfer stage TS1 as described above (see FIG. 17B). The wafer A delivered to the top ring 301A is attracted under suction by a vacuum suction mechanism of the top ring 301A, and moved on the polishing table 300A while being attracted by the vacuum suction mechanism. Then, the wafer A is polished by the polishing surface, such as a polishing pad or a grinding stone, attached onto the polishing table 300A. The polished wafer A is moved above the pusher 31 by the swinging motion of the top ring 301A and transferred to the pusher 31. The wafer A is placed on the transfer stage TS2 when the pusher 31 is lowered (see FIG. 17C). Then, the upper transfer stages TS1, TS2, TS3, and TS4 move toward the transferring position TP6, and the lower transfer stages TS5 and TS6 move toward the transferring position TP1. Thus, the wafer A on the transfer stage TS2 is moved to the wafer receiving/delivering position (transferring position TP4) for the top ring 301B, and the wafer B on the transfer stage TS1 is moved to the wafer receiving/delivering position (transferring position TP3) for the top ring 301A (see FIG. 17D).

Figure 18A:
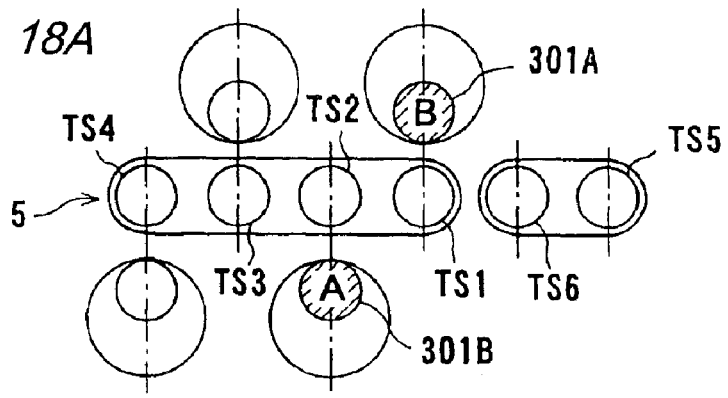
FIGS. 18A through 18D are schematic diagrams explanatory of operation of the linear transporter in the polishing section shown in FIG. 1 when serial processing is performed.
Figure 18B:
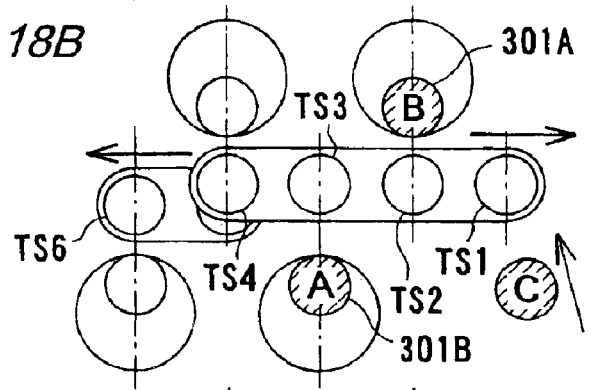
Figure 18C:
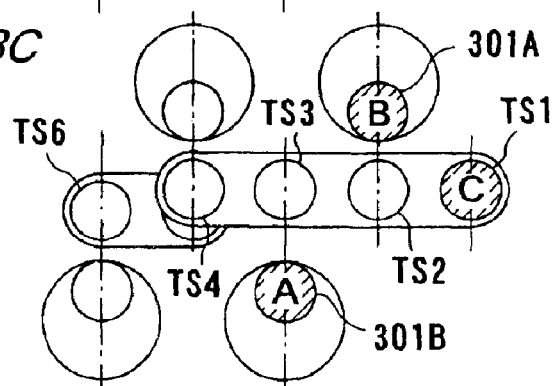
Figure 18D:
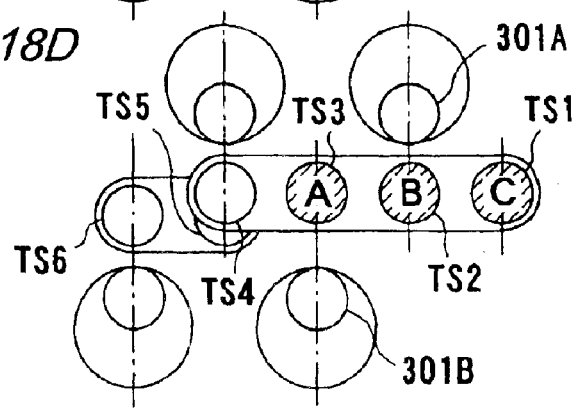
Figure 19A:
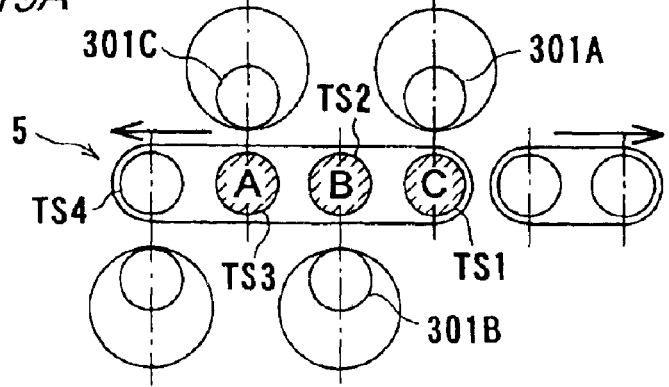
FIGS. 19A through 19D are schematic diagrams explanatory of operation of the linear transporter in the polishing section shown in FIG. 1 when serial processing is performed.
Figure 19B:
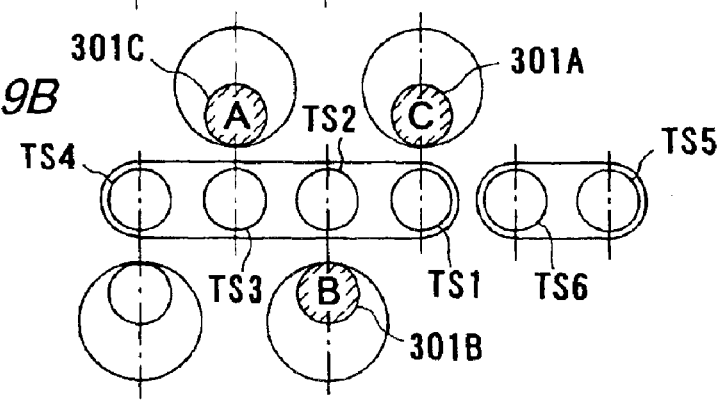
Figure 19C:
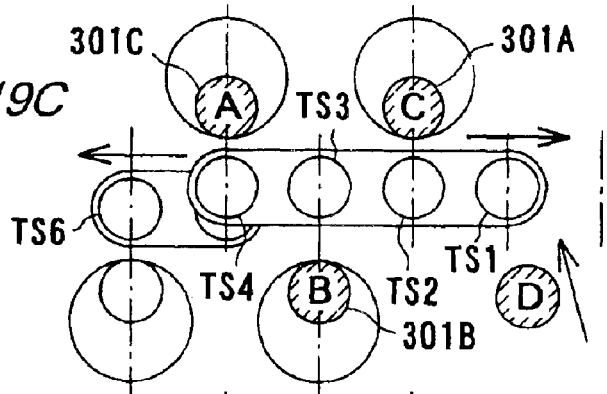
Figure 19D:
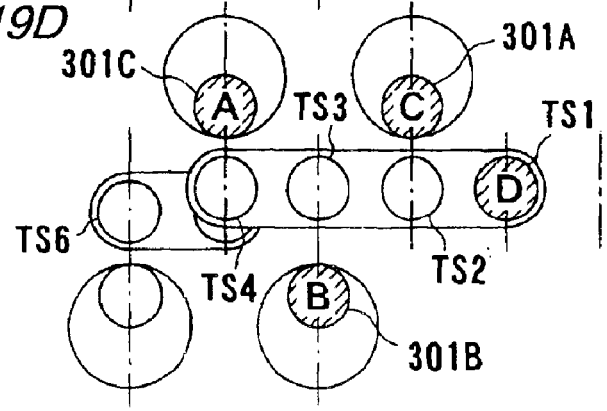

Then, the pusher 32 located at the transferring position TP4 and the pusher 31 located at the transferring position TP3 are lifted to transfer the wafer A and the wafer B from the transfer stage TS2 and the transfer stage TS1 to the top ring 301B and the top ring 301A, respectively (see FIG. 18A). Next, the upper transfer stages TS1, TS2, TS3, and TS4 move toward the transferring position TP1, and the lower transfer stages TS5 and TS6 move toward the transferring position TP6 (see FIG. 18B). At that time, the second transfer robot 44A places another wafer C on the transfer stage TS1 as described above (see FIG. 18C). The wafer A and the wafer B which have been polished in the respective polishing units are placed on the transfer stage TS3 and the transfer stage TS2 by the pusher 32 and the pusher 31, respectively (see FIG. 18D).

Then, the upper transfer stages TS1, TS2, TS3, and TS4 move toward the transferring position TP6, and the lower transfer stages TS5 and TS6 move toward the transferring position TP1. Thus, the wafer A on the transfer stage TS3 is moved to the wafer receiving/delivering position (transferring position TP5) for the top ring 301C, the wafer B on the transfer stage TS2 is moved to the wafer receiving/delivering position (transferring position TP4) for the top ring 301B, and the wafer C on the transfer stage TS1 is moved to the wafer receiving/delivering position (transferring position TP3) for the top ring 301A (see FIG. 19A). Then, the pusher 33 located at the transferring position TP5, the pusher 32 located at the transferring position TP4, and the pusher 31 located at the transferring position TP3 are lifted to transfer the wafer A, the wafer B, and the wafer C from the transfer stage TS3, the transfer stage TS2, and the transfer stage TS1 to the top ring 301C, the top ring 301B, and the top ring 301A, respectively (see FIG. 19B). Next, the upper transfer stages TS1, TS2, TS3, and TS4 move toward the transferring position TP1, and the lower transfer stages TS5 and TS6 move toward the transferring position TP6 (see FIG. 19C). At that time, the second transfer robot 44A places another wafer D on the transfer stage TS1 as described above (see FIG. 19D).

The wafer A, the wafer B, and the wafer C which have been polished in the respective polishing units are placed on the transfer stage TS4, the transfer stage TS3, and the transfer stage TS2 by the pusher 33, the pusher 32, and the pusher 31, respectively (see FIG. 20A). Then, the upper transfer stages TS1, TS2, TS3, and TS4 move toward the transferring position TP6, and the lower transfer stages TS5 and TS6 move toward the transferring position TP1. Thus, the wafer A on the transfer stage TS4 is moved to the wafer receiving/delivering position (transferring position TP6) for the top ring 301D, the wafer B on the transfer stage TS3 is moved to the wafer receiving/delivering position (transferring position TP5) for the top ring 301C, the wafer C on the transfer stage TS2 is moved to the wafer receiving/delivering position (transferring position TP4) for the top ring 301B, and the wafer D on the transfer stage TS1 is moved to the wafer receiving/delivering position (transferring position TP3) for the top ring 301A (see FIG. 20B).

Then, the pusher 34 located at the transferring position TP6, the pusher 33 located at the transferring position TP5, the pusher 32 located at the transferring position TP4, and the pusher 31 located at the transferring position TP3 are lifted to transfer the wafer A, the wafer B, the wafer C, and the wafer D from the transfer stage TS4, the transfer stage TS3, the transfer stage TS2, and the transfer stage TS1 to the top ring 301D, the top ring 301C, the top ring 301B, and the top ring 301A, respectively (see FIG. 20C). Next, the upper transfer stages TS1, TS2, TS3, and TS4 move toward the transferring position TP1, and the lower transfer stages TS5 and TS6 move toward the transferring position TP6 (see FIG. 20D). At that time, the second transfer robot 44A places another wafer E on the transfer stage TS1 as described above (see FIG. 21A).

Figure 21A:
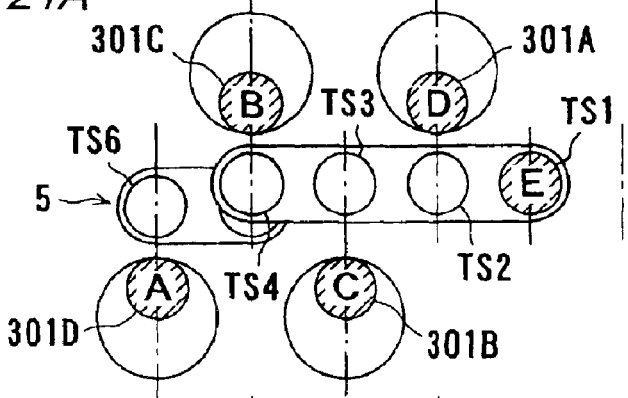
FIGS. 21A through 21D are schematic diagrams explanatory of operation of the linear transporter in the polishing section shown in FIG. 1 when serial processing is performed.
Figure 21B:
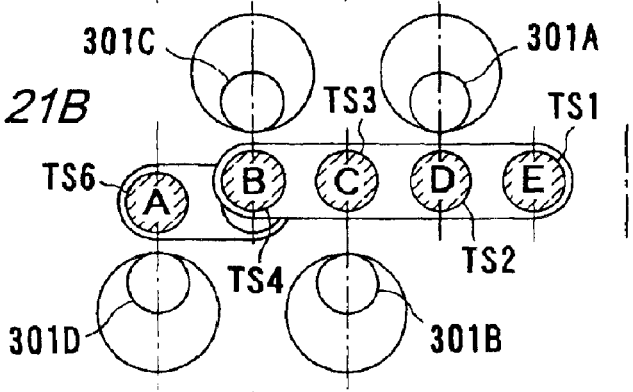
Figure 21C:
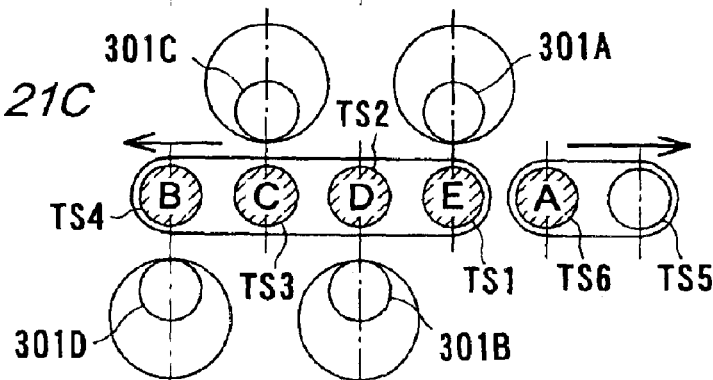
Figure 21D:
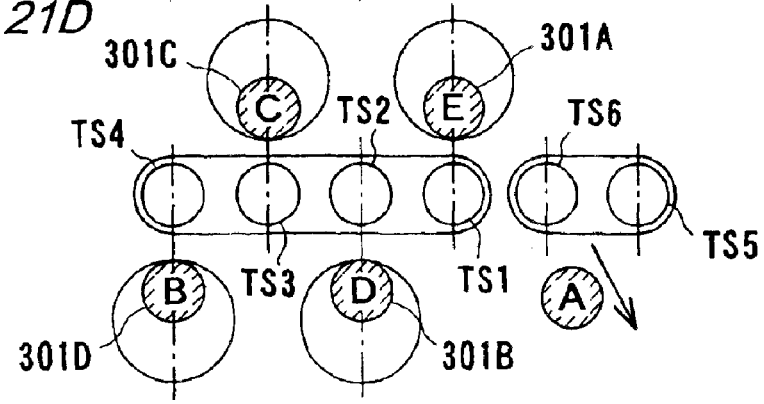

The wafer A, the wafer B, the wafer C, and the wafer D which have been polished in the respective polishing units are placed on the transfer stage TS6, the transfer stage TS4, the transfer stage TS3, and the transfer stage TS2 by the pusher 34, the pusher 33, the pusher 32, and the pusher 31, respectively (see FIG. 21B). Then, the upper transfer stages TS1, TS2, TS3, and TS4 move toward the transferring position TP6, and the lower transfer stages TS5 and TS6 move toward the transferring position TP1. Thus, the wafer A on the transfer stage TS6 is moved to the transferring position TP2, the wafer B on the transfer stage TS4 is moved to the wafer receiving/delivering position (transferring position TP6) for the top ring 301D, the wafer C on the transfer stage TS3 is moved to the wafer receiving/delivering position (transferring position TP5) for the top ring 301C, the wafer D on the transfer stage TS2 is moved to the wafer receiving/delivering position (transferring position TP4) for the top ring 301B, and the wafer E on the transfer stage TS1 is moved to the wafer receiving/delivering position (transferring position TP3) for the top ring 301A (see FIG. 21C). Then, the pusher 34 located at the transferring position TP6, the pusher 33 located at the transferring position TP5, the pusher 32 located at the transferring position TP4, and the pusher 31 located at the transferring position TP3 are lifted to transfer the wafer B, the wafer C, the wafer D, and the wafer E from the transfer stage TS4, the transfer stage TS3, the transfer stage TS2, and the transfer stage TS1 to the top ring 301D, the top ring 301C, the top ring 301B, and the top ring 301A, respectively (see FIG. 21D). At that time, the wafer A on the transferring position TP2 is transferred to the first cleaning unit 43A in the cleaning section 4 by the second transfer robot 44A.

Next, the upper transfer stages TS1, TS2, TS3, and TS4 move toward the transferring position TP1, and the lower transfer stages TS5 and TS6 move toward the transferring position TP6 (see FIG. 22A). At that time, the second transfer robot 44A places another wafer F on the transfer stage TS1 as described above (see FIG. 22B). The wafer B, the wafer C, the wafer D, and the wafer E which have been polished in the respective polishing units are placed on the transfer stage TS6, the transfer stage TS4, the transfer stage TS3, and the transfer stage TS2 by the pusher 34, the pusher 33, the pusher 32, and the pusher 31, respectively (see FIG. 22C). Then, the upper transfer stages TS1, TS2, TS3, and TS4 move toward the transferring position TP6, and the lower transfer stages TS5 and TS6 move toward the transferring position TP1. Thus, the wafer B on the transfer stage TS6 is moved to the transferring position TP2, the wafer C on the transfer stage TS4 is moved to the wafer receiving/delivering position (transferring position TP6) for the top ring 301D, the wafer D on the transfer stage TS3 is moved to the wafer receiving/delivering position (transferring position TP5) for the top ring 301C, the wafer E on the transfer stage TS2 is moved to the wafer receiving/delivering position (transferring position TP4) for the top ring 301B, and the wafer F on the transfer stage TS1 is moved to the wafer receiving/delivering position (transferring position TP3) for the top ring 301A (see FIG. 22D).

Figures 23A, 23B, 23C, 23D:
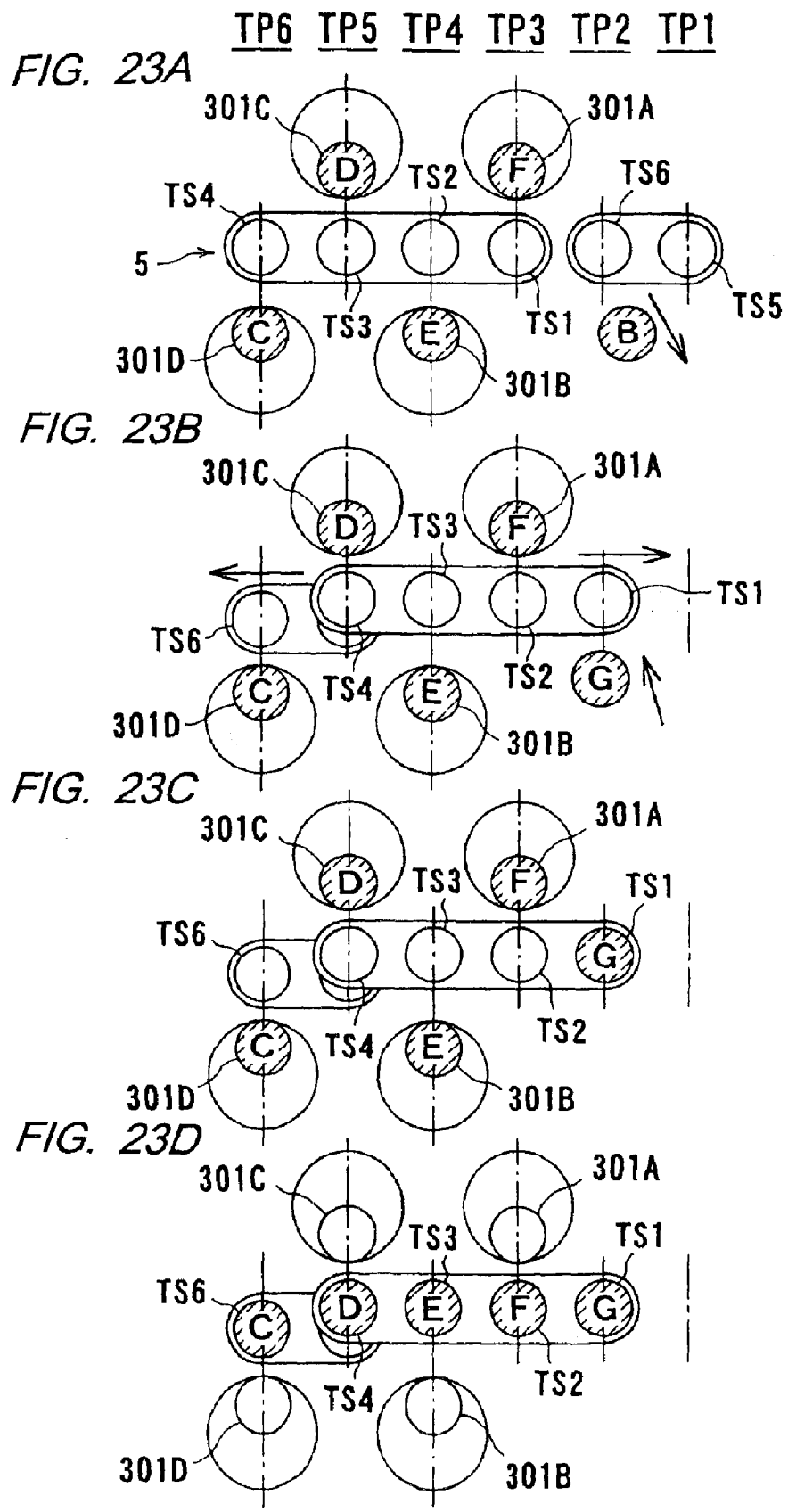
FIGS. 23A through 23D are schematic diagrams explanatory of operation of the linear transporter in the polishing section shown in FIG. 1 when serial processing is performed.
Figure 24A:
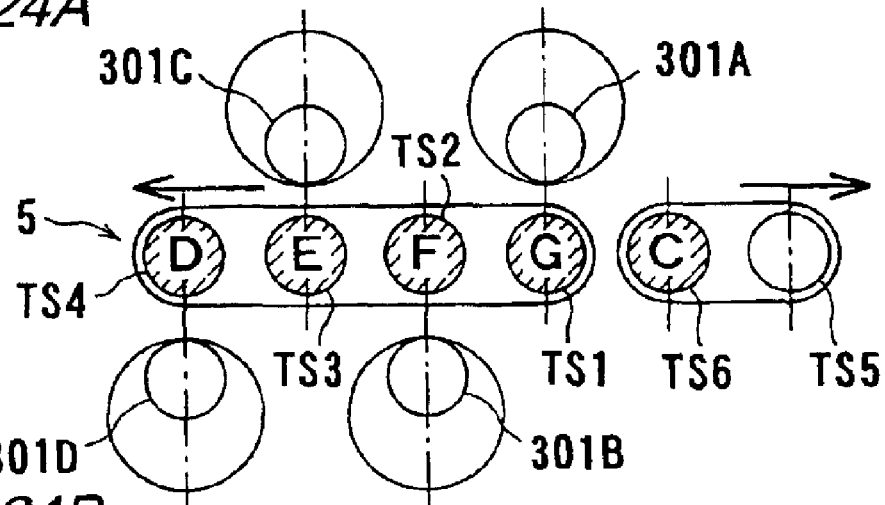
FIGS. 24A through 24C are schematic diagrams explanatory of operation of the linear transporter in the polishing section shown in FIG. 1 when serial processing is performed.
Figure 24B:
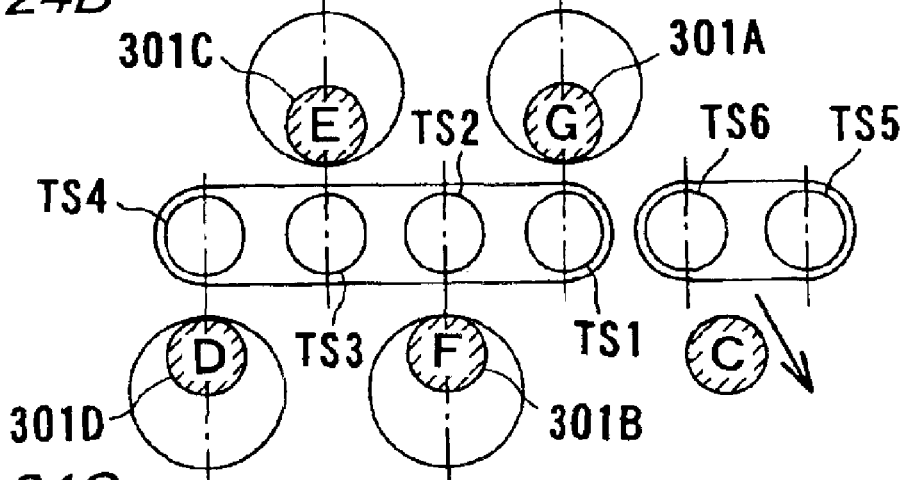
Figure 24C:
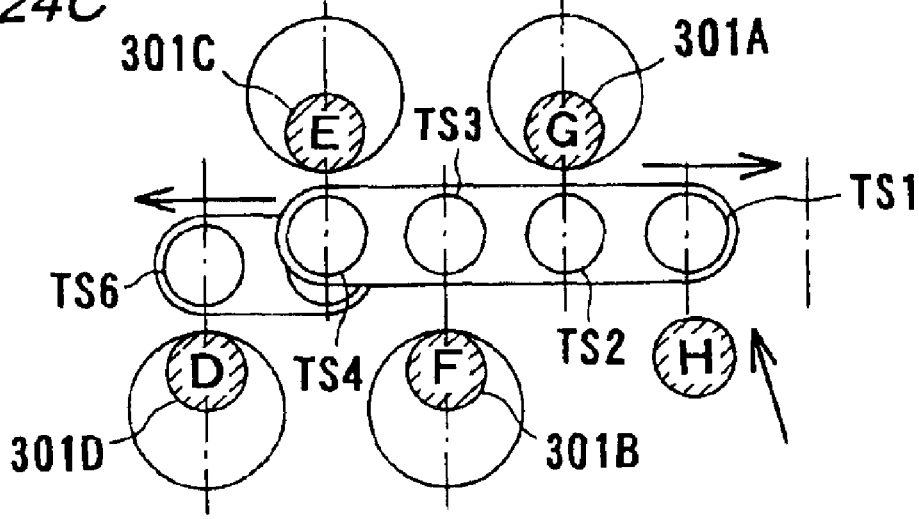

Then, the pusher 34 located at the transferring position TP6, the pusher 33 located at the transferring position TP5, the pusher 32 located at the transferring position TP4, and the pusher 31 located at the transferring position TP3 are lifted to transfer the wafer C, the wafer D, the wafer E, and the wafer F from the transfer stage TS4, the transfer stage TS3, the transfer stage TS2, and the transfer stage TS1 to the top ring 301D, the top ring 301C, the top ring 301B, and the top ring 301A, respectively (see FIG. 23A). At that time, the wafer B on the transferring position TP2 is transferred to the first cleaning unit 43A in the cleaning section 4 by the second transfer robot 44A. Next, the upper transfer stages TS1, TS2, TS3, and TS4 move toward the transferring position TP1, and the lower transfer stages TS5 and TS6 move toward the transferring position TP6 (see FIG. 23B). At that time, the second transfer robot 44A places another wafer G on the transfer stage TS1 as described above (see FIG. 23C). The wafer C, the wafer D, the wafer E, and the wafer F which have been polished in the respective polishing units are placed on the transfer stage TS6, the transfer stage TS4, the transfer stage TS3, and the transfer stage TS2 by the pusher 34, the pusher 33, the pusher 32, and the pusher 31, respectively (see FIG. 23D). Then, the upper transfer stages TS1, TS2, TS3, and TS4 move toward the transferring position TP6, and the lower transfer stages TS5 and TS6 move toward the transferring position TP1. Thus, the wafer C on the transfer stage TS6 is moved to the transferring position TP2, the wafer D on the transfer stage TS4 is moved to the wafer receiving/delivering position (transferring position TP6) for the top ring 301D, the wafer E on the transfer stage TS3 is moved to the wafer receiving/delivering position (transferring position TP5) for the top ring 301C, the wafer F on the transfer stage TS2 is moved to the wafer receiving/delivering position (transferring position TP4) for the top ring 301B, and the wafer G on the transfer stage TS1 is moved to the wafer receiving/delivering position (transferring position TP3) for the top ring 301A (see FIG. 24A). Then, the pusher 34 located at the transferring position TP6, the pusher 33 located at the transferring position TP5, the pusher 32 located at the transferring position TP4, and the pusher 31 located at the transferring position TP3 are lifted to transfer the wafer D, the wafer E, the wafer F, and the wafer G from the transfer stage TS4, the transfer stage TS3, the transfer stage TS2, and the transfer stage TS1 to the top ring 301D, the top ring 301C, the top ring 301B, and the top ring 301A, respectively (see FIG. 24B). At that time, the wafer C on the transferring position TP2 is transferred to the first cleaning unit 43A in the cleaning section 4 by the second transfer robot 44A. Next, the upper transfer stages TS1, TS2, TS3, and TS4 move toward the transferring position TP1, and the lower transfer stages TS5 and TS6 move toward the transferring position TP6 (see FIG. 24C). Thereafter, the processes described in connection with FIGS. 23C through 24C are repeated.

Such serial processing is effective in using different types of slurry in the respective polishing units. In the above example, since polishing can be performed sequentially in the four polishing units, it is possible to achieve a polishing process which could not be performed by a conventional polishing apparatus. When a three-stage polishing process is performed, the polishing apparatus according to the present invention can operate the respective polishing units efficiently for an average polishing time. For example, if a primary polishing for 3 minutes, a secondary polishing for 1.5 minutes, and a tertiary polishing for 1.5 minutes are performed, then the first polishing unit 30A can perform a primary polishing for 1.5 minutes, the second polishing unit 30B a primary polishing for 1.5 minutes, the third polishing unit 30C a secondary polishing for 1.5 minutes, and the fourth polishing unit 30D a tertiary polishing for 1.5 minutes.

Figure 25:
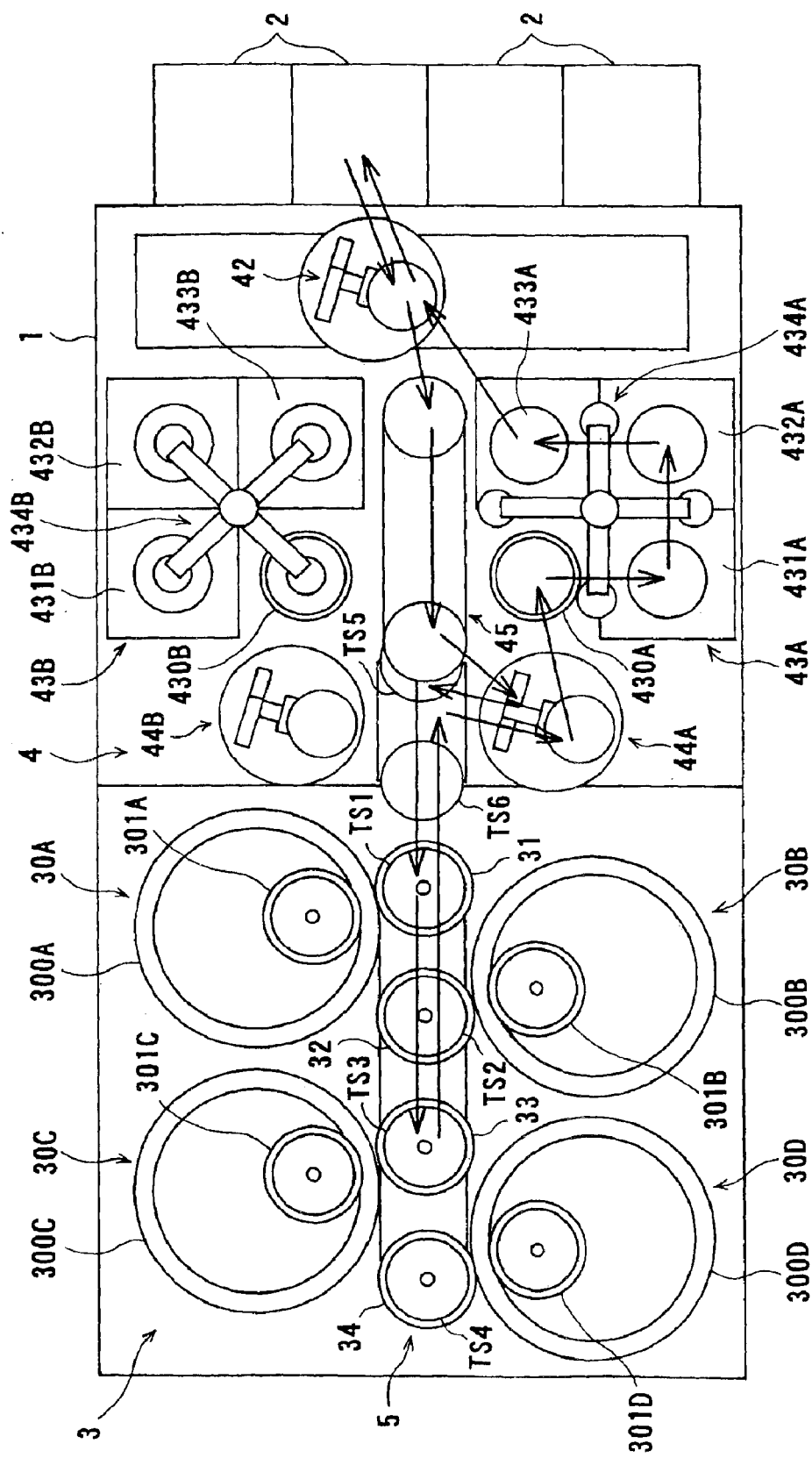
FIG. 25 is a plan view showing an example of movement of a wafer when parallel processing is performed.
Figure 26:
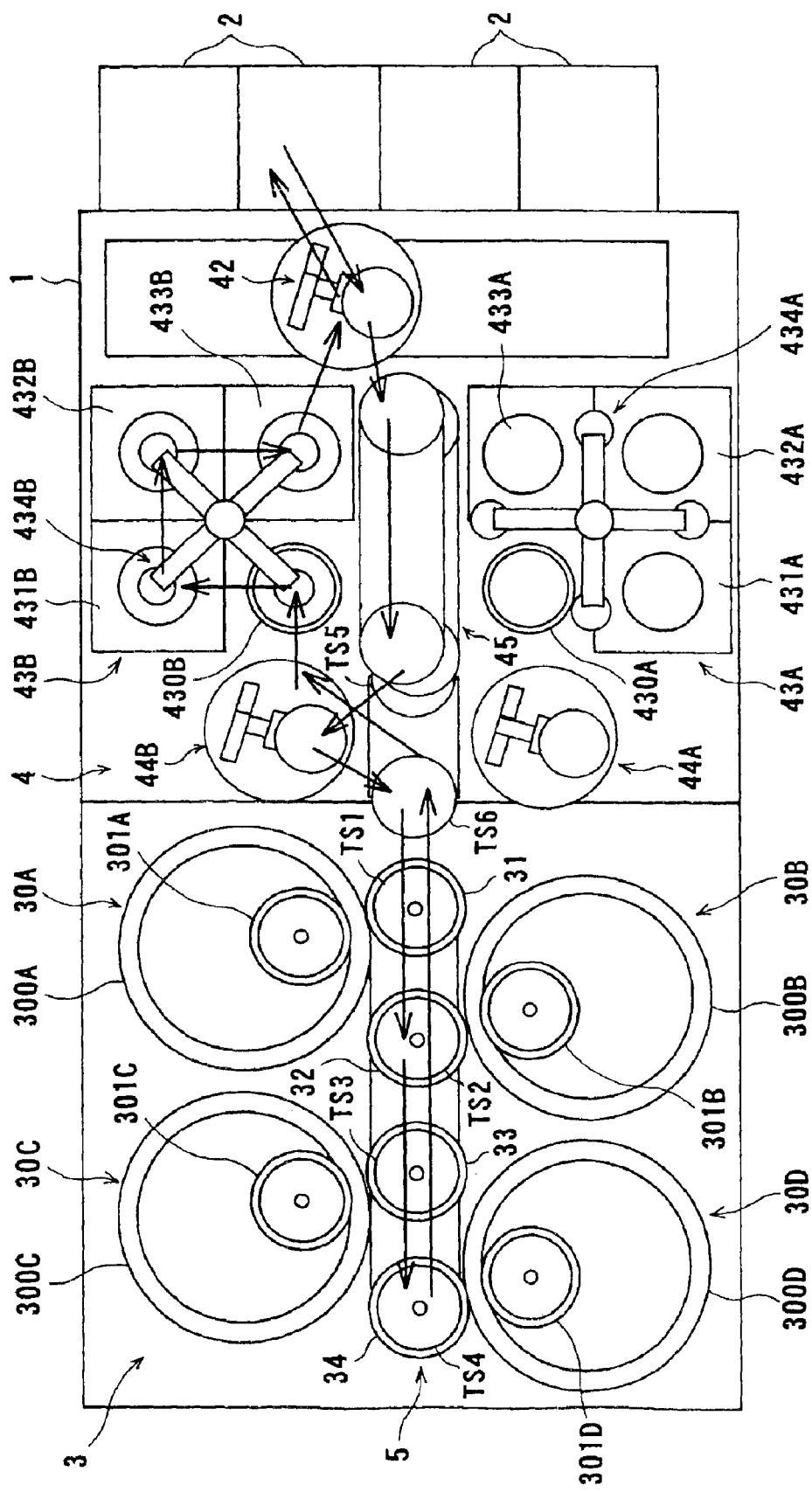
FIG. 26 is a plan view showing an example of movement of a wafer when parallel processing is performed.
Figure 27A:
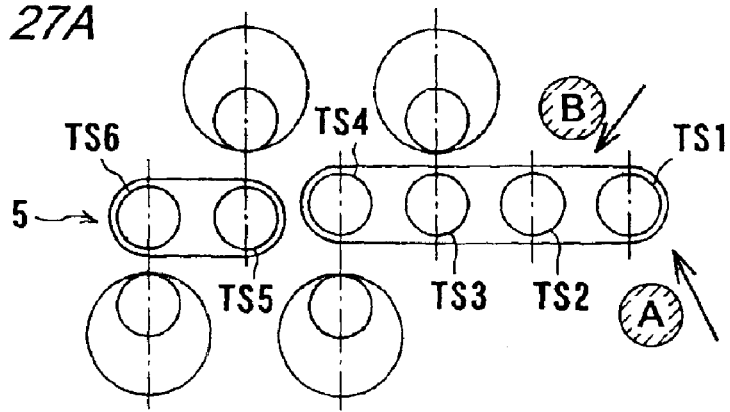
FIGS. 27A through 27D are schematic diagrams explanatory of operation of the linear transporter in the polishing section shown in FIG. 1 when parallel processing is performed.
Figure 27B:
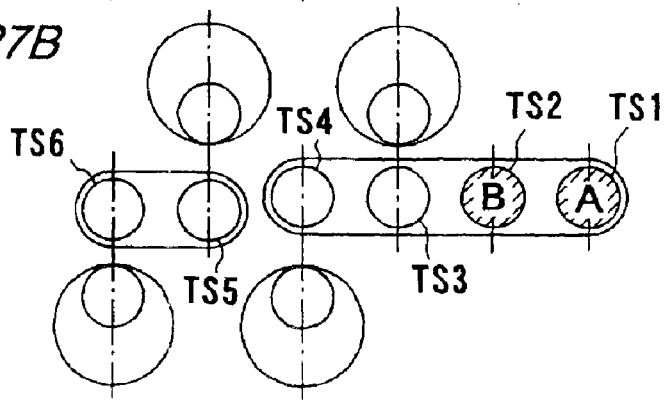
Figure 27C:
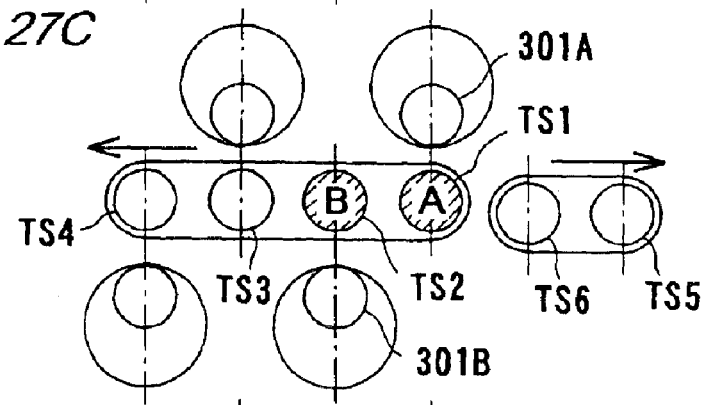
Figure 27D:
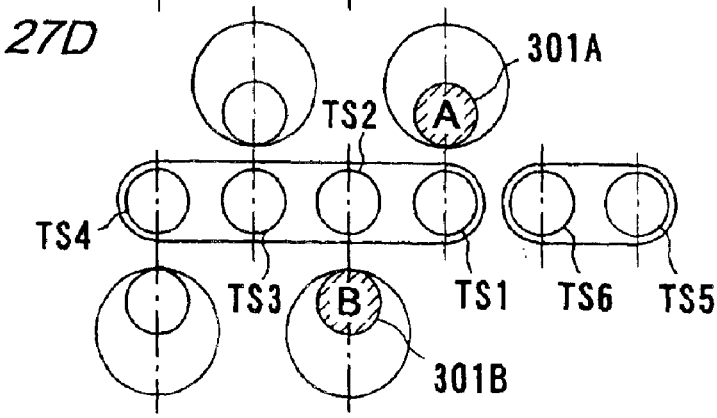

FIGS. 25 and 26 show an example of movement of a wafer when parallel processing is performed. When parallel processing is performed, as shown in FIG. 25, a wafer is processed on the following route: the wafer cassette of the loading/unloading stage 2→the first transfer robot 42 (reversed)→the linear transporter 45→the second transfer robot 44A→the transfer stage TS1 of the linear transporter 5→the pusher 31→the top ring 301A→the polishing table 300A→the pusher 31→the transfer stage TS3 of the linear transporter 5→the pusher 33→the top ring 301C→the polishing table 300C→the pusher 33→the transfer stage TS5 of the linear transporter 5→the second transfer robot 44A→the reversing machine 430A→of the first cleaning unit 43A→the transferring mechanism 434A→the primary cleaning device 431A→the transferring mechanism 434A→the secondary cleaning device 432A→the transferring mechanism 434A→the tertiary cleaning device 433A→the first transfer robot 42→the wafer cassette of the loading/unloading stage 2.

As shown in FIG. 26, another wafer is processed on the following route: the wafer cassette of the loading/unloading stage 2→the first transfer robot 42 (reversed)→the linear transporter 45→the third transfer robot 44B→the transfer stage TS2 of the linear transporter 5→the pusher 32→the top ring 301B→the polishing table 300B→the pusher 32→the transfer stage TS4 of the linear transporter 5→the pusher 34→the top ring 301D→the polishing table 300D→the pusher 34→the transfer stage TS6 of the linear transporter 5→the third transfer robot 44B→the reversing machine 430B of the second cleaning unit 43B→the transferring mechanism 434B→the primary cleaning device 431B→the transferring mechanism 434B→the secondary cleaning device 432B→the transferring mechanism 434B→the tertiary cleaning device 433B→the first transfer robot 42→the wafer cassette of the loading/unloading stage 2.

Operation of the linear transporter 5 in the polishing section 3 will be described below with reference to FIGS. 27A through 32B.

First, the second transfer robot 44A places a wafer A on the transfer stage TS1 which is located on the transferring position TP1 in the linear transporter 5, and the third transfer robot 44B places a wafer. B on the transfer stage TS2 which is located on the transferring position TP2 in the linear transporter 5 (see FIGS. 27A and 27B). The upper transfer stages TS1, TS2, TS3, and TS4 move toward the transferring position TP6, and the lower transfer stages TS5 and TS6 move toward the transferring position TP1. Thus, the wafer A on the transfer stage TS1 is moved to the wafer receiving/delivering position (transferring position TP3) for the top ring 301A, the wafer B on the transfer stage TS2 is moved to the wafer receiving/delivering position (transferring position TP4) for top ring 301B (see FIG. 27C). Then, the pusher 31 located at the transferring position TP3 and the pusher 32 located at the transferring position TP4 are lifted to transfer the wafer A and the wafer B from the transfer stage TS1 and the transfer stage TS2 of the linear transporter 5 to the top ring 301A and the top ring 301B, respectively (see FIG. 27D).

Figure 28A:
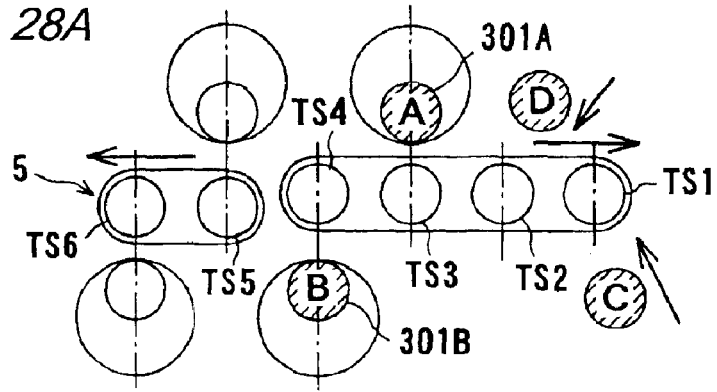
FIGS. 28A through 28D are schematic diagrams explanatory of operation of the linear transporter in the polishing section shown in FIG. 1 when parallel processing is performed.
Figure 28B:
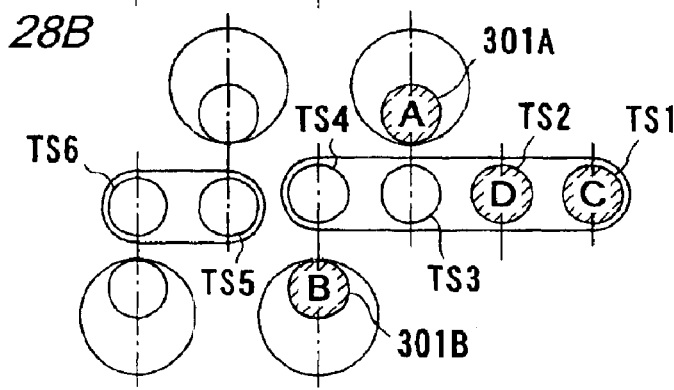
Figure 28C:
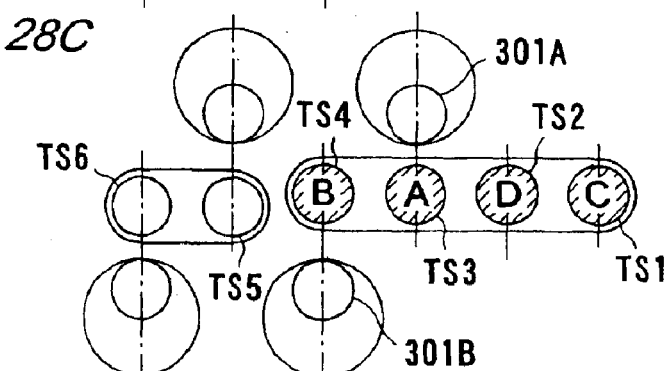
Figure 28D:
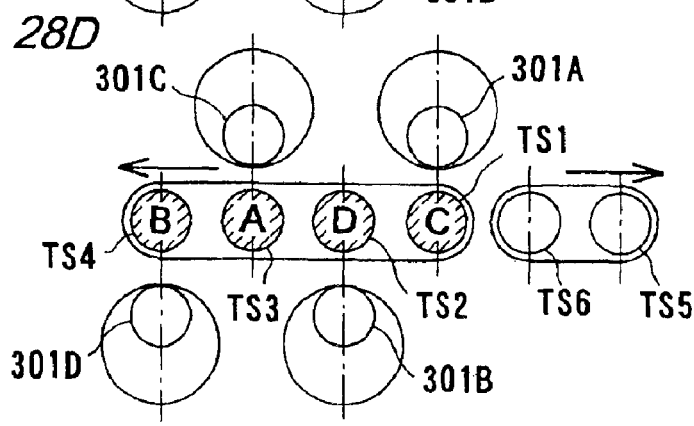

Next, the upper transfer stages TS1, TS2, TS3, and TS4 move toward the transferring position TP1, and the lower transfer stages TS5 and TS6 move toward the transferring position TP6 (see FIG. 28A). At that time, the second transfer robot 44A places a wafer C on the transfer stage TS1, and the third transfer robot 44B places a wafer D on the transfer stage TS2, as described above (see FIG. 28B). The wafer A and the wafer B which have been polished in the respective polishing units are placed on the transfer stage TS3 and the transfer stage TS4 by the pusher 31 and the pusher 32, respectively (FIG. 28C). Then, the upper transfer stages TS1, TS2, TS3, and TS4 move toward the transferring position TP6, and the lower transfer stages TS5 and TS6 move toward the transferring position TP1. Thus, the wafer C on the transfer stage TS1 is moved to the wafer receiving/delivering position (transferring position TP3) for the top ring 301A, the wafer D on the transfer stage TS2 is moved to the wafer receiving/delivering position (transferring position TP4) for the top ring 301B, the wafer A on the transfer stage TS3 is moved to the wafer receiving/delivering position (transferring position TP5) for the top ring 301C, and the wafer B on the transfer stage TS4 is moved to the wafer receiving/delivering position (transferring position TP6) for the top ring 301D (see FIG. 28D).

Figure 29A:
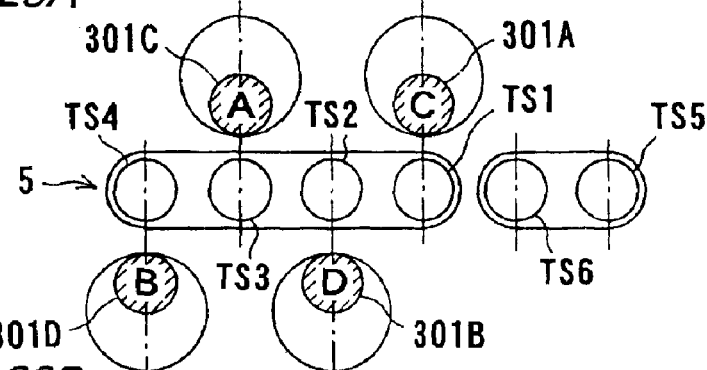
FIGS. 29A through 29D are schematic diagrams explanatory of operation of the linear transporter in the polishing section shown in FIG. 1 when parallel processing is performed.
Figure 29B:
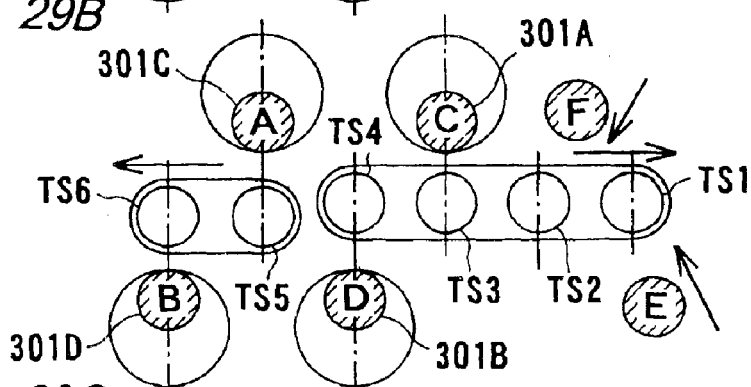
Figure 29C:
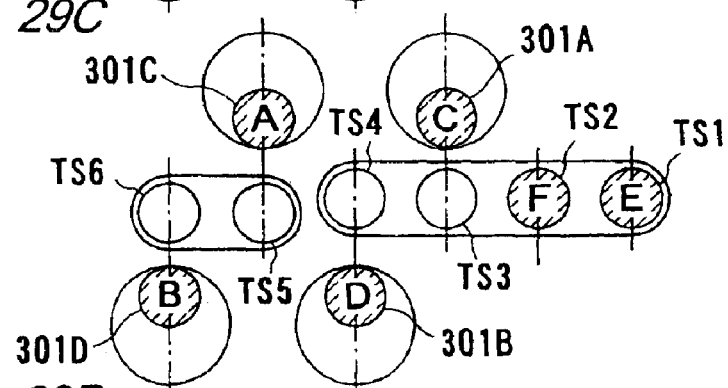
Figure 29D:
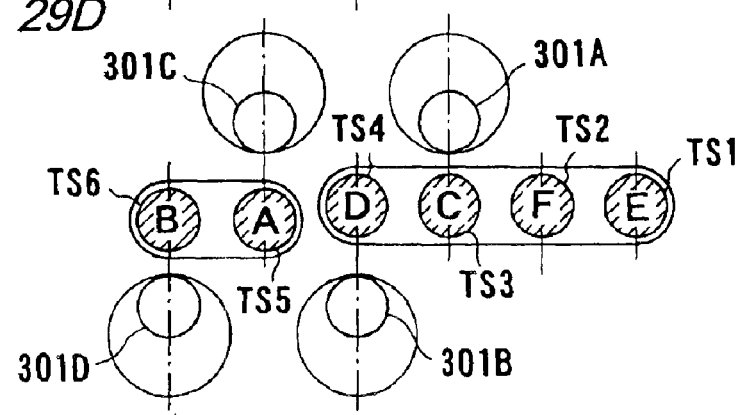

Then, the pusher 31 located at the transferring position TP3, the pusher 32 located at the transferring position TP4, the pusher 33 located at the transferring position TP5, and the pusher 34 located at the transferring position TP6 are lifted to transfer the wafer C, the wafer D, the wafer A, and the wafer B from the transfer stage TS1, the transfer stage TS2, the transfer stage TS3, and the transfer stage TS4 to the top ring 301A, the top ring 301B, the top ring 301C, the top ring 301D, respectively (see FIG. 29A). Next, the upper transfer stages TS1, TS2, TS3, and TS4 move toward the transferring position TP1, and the lower transfer stages TS5 and TS6 move toward the transferring position TP6 (see FIG. 29B). At that time, the second transfer robot 44A places a wafer E on the transfer stage TS1, and the third transfer robot 44B places a wafer F on the transfer stage TS2, as described above (see FIG. 29C). The wafer C, the wafer D, the wafer A, and the wafer B which have been polished in the respective polishing units are placed on the transfer stage TS3, the transfer stage TS4, the transfer stage TS5, and the transfer stage TS6 by the pusher 31, the pusher 32, the pusher 33, and the pusher 34, respectively (FIG. 29D). Next, the upper transfer stages TS1, TS2, TS3, and TS4 move toward the transferring position TP6, and the lower transfer stages TS5 and TS6 move toward the transferring position TP1. Thus, the wafer A on the transfer stage TS5 is moved to the transferring position TP1, the wafer B on the transfer stage TS6 is moved to the transferring position TP2, the wafer E on the transfer stage TS1 is moved to the wafer receiving/delivering position (transferring position TP3) for the top ring 301A, the wafer F on the transfer stage TS2 is moved to the wafer receiving/delivering position (transferring position TP4) for the top ring 301B, the wafer C on the transfer stage TS3 is moved to the wafer receiving/delivering position (transferring position TP5) for the top ring 301C, and the wafer D on the transfer stage TS4 is moved to the wafer receiving/delivering position (transferring position TP6) for the top ring 301D (see FIG. 30A).

Figure 30A:
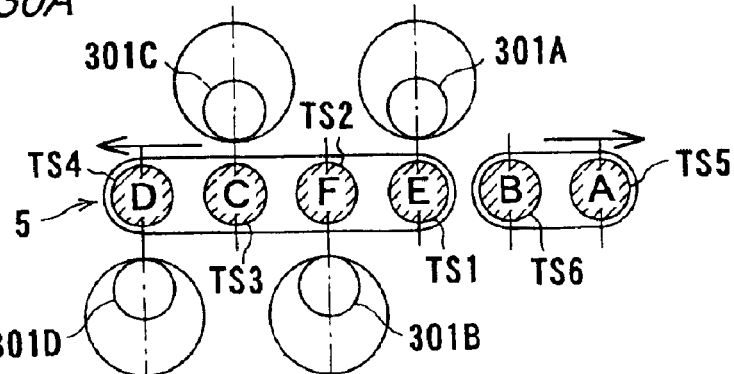
FIGS. 30A through 30D are schematic diagrams explanatory of operation of the linear transporter in the polishing section shown in FIG. 1 when parallel processing is performed.
Figure 30B:
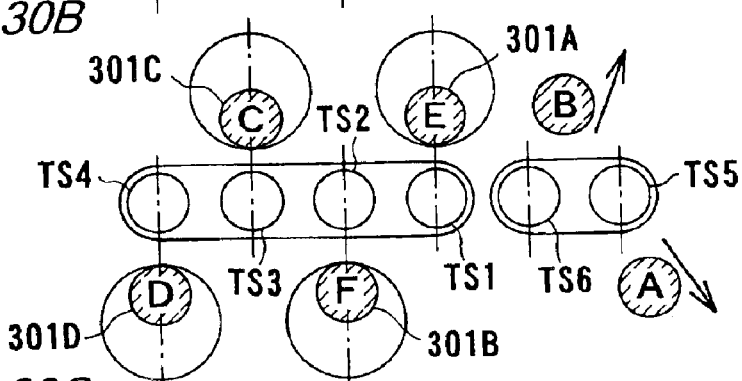
Figure 30C:
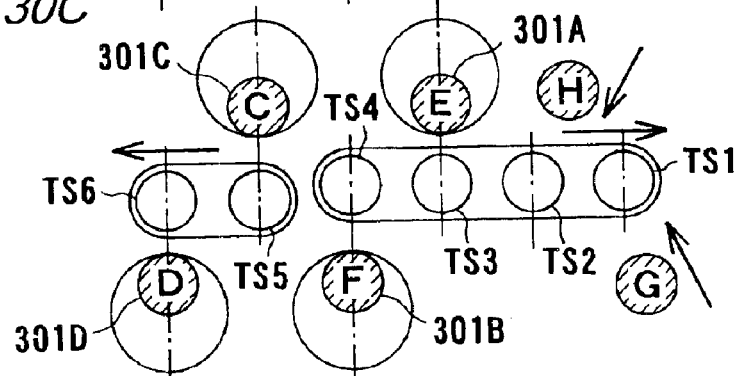
Figure 30D:
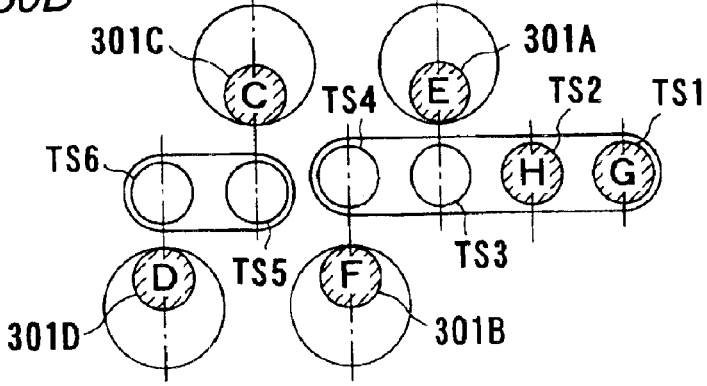

Then, the pusher 31 located at the transferring position TP3, the pusher 32 located at the transferring position TP4, the pusher 33 located at the transferring position TP5, and the pusher 34 located at the transferring position TP6 are lifted to transfer the wafer E, the wafer F, the wafer C, and the wafer D from the transfer stage TS1, the transfer stage TS2, the transfer stage TS3, and the transfer stage TS4 to the top ring 301A, the top ring 301B, the top ring 301C, the top ring 301D, respectively (see FIG. 30B). At that time, the wafer A on the transferring position TP1 and the wafer B on the transferring position TP2 are transferred to the cleaning unit 43A and the cleaning unit 43B by the second transfer robot 44A and the third transfer robot 44B, respectively. Next, the upper transfer stages TS1, TS2, TS3, and TS4 move toward the transferring position TP1, and the lower transfer stages TS5 and TS6 move toward the transferring position TP6 (see FIG. 30C). At that time, the second transfer robot 44A places a wafer G on the transfer stage TS1, and the third transfer robot 44B places a wafer H on the transfer stage TS2, as described above (see FIG. 30D).

Figure 31A:
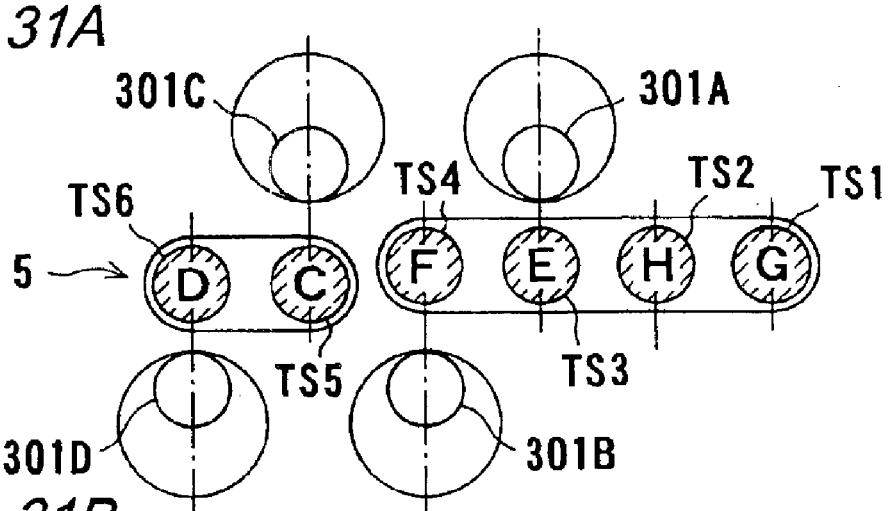
FIGS. 31 through 31C are schematic diagrams explanatory of operation of the linear transporter in the polishing section shown in FIG. 1 when parallel processing is performed.
Figure 31B:
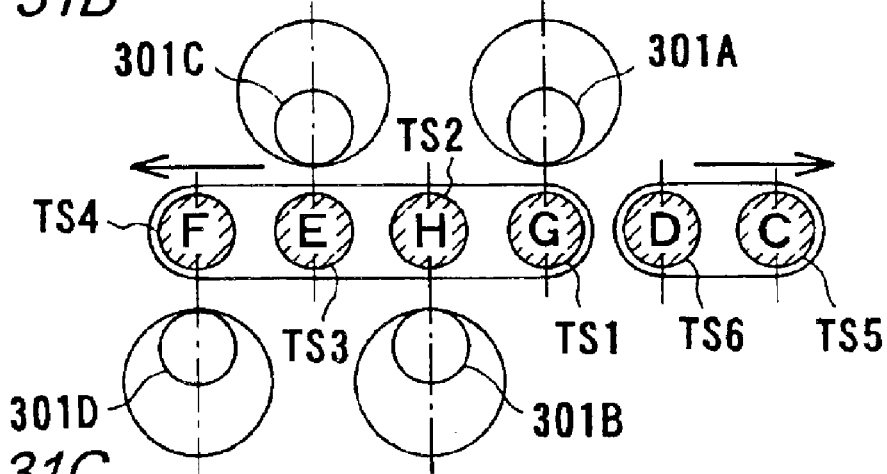
Figure 31C:
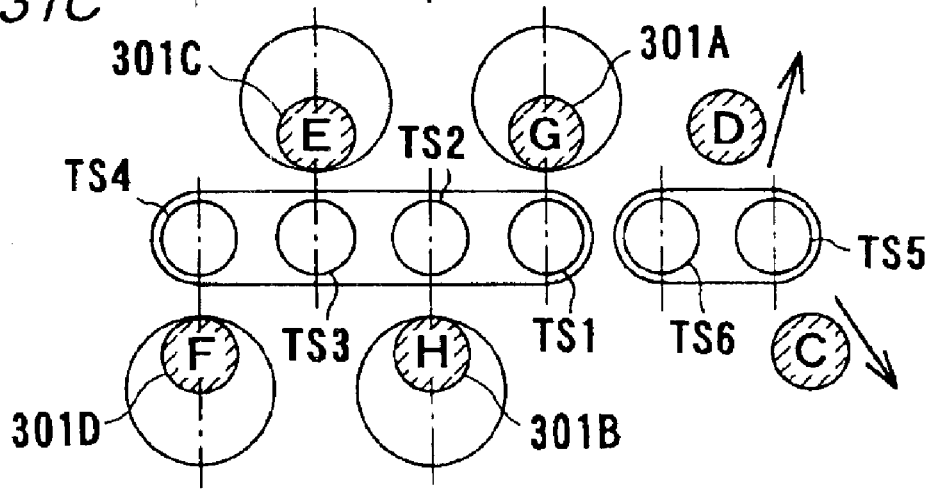

The wafer E, the wafer F, the wafer C, and the wafer D which have been polished in the respective polishing units are placed on the transfer stage TS3, the transfer stage TS4, the transfer stage TS5, and the transfer stage TS6 by the pusher 31, the pusher 32, the pusher 33, and the pusher 34, respectively (FIG. 31A). Next, the upper transfer stages TS1, TS2, TS3, and TS4 move toward the transferring position TP6, and the lower transfer stages TS5 and TS6 move toward the transferring position TP1 (see FIG. 31B). Thus, the wafer C on the transfer stage TS5 is moved to the transferring position TP1, the wafer D on the transfer stage TS6 is moved to the transferring position TP2, the wafer G on the transfer stage TS1 is moved to the wafer receiving/delivering position (transferring position TP3) for the top ring 301A, the wafer H on the transfer stage TS2 is moved to the wafer receiving/delivering position (transferring position TP4) for the top ring 301B, the wafer E on the transfer stage TS3 is moved to the wafer receiving/delivering position (transferring position TP5) for the top ring 301C, and the wafer F on the transfer stage TS4 is moved to the wafer receiving/delivering position (transferring position TP6) for the top ring 301D (see FIG. 31B). Then, the pusher 31 located at the transferring position TP3, the pusher 32 located at the transferring position TP4, the pusher 33 located at the transferring position TP5, and the pusher 34 located at the transferring position TP6 are lifted to transfer the wafer Q the wafer H, the wafer E, and the wafer F from the transfer stage TS1, the transfer stage TS2, the transfer stage TS3, and the transfer stage TS4 to the top ring 301A, the top ring 301B, the top ring 301C, the top ring 301D, respectively (see FIG. 31C). At that time, the wafer C on the transferring position TP1 and the wafer D on the transferring position TP2 are transferred to the cleaning unit 43A and the cleaning unit 43B by the second transfer robot 44A and the third transfer robot 44B, respectively.

Figure 32A:
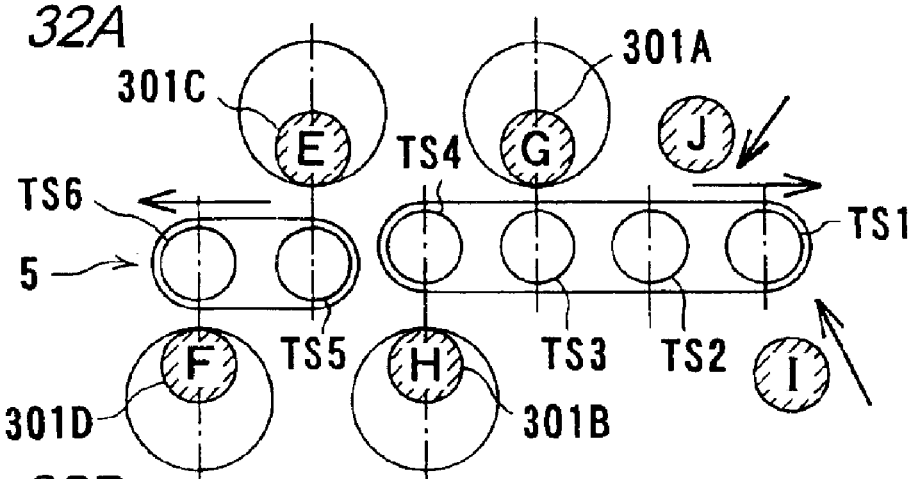
FIGS. 32A and 32B are schematic diagrams explanatory of operation of the linear transporter in the polishing section shown in FIG. 1 when parallel processing is performed.
Figure 32B:
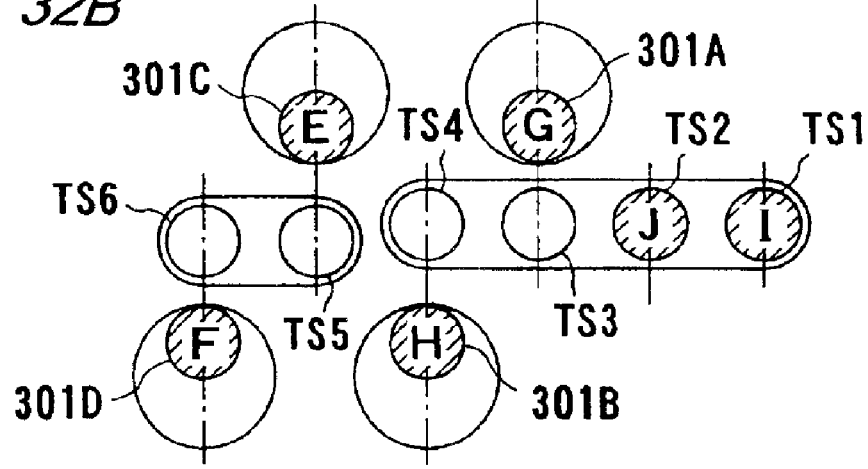

Next, the upper transfer stages TS1, TS2, TS3, and TS4 move toward the transferring position TP1, and the lower transfer stages TS5 and TS6 move toward the transferring position TP6 (see FIG. 32A). At that time, the second transfer robot 44A places a wafer 0 on the transfer stage TS1, and the third transfer robot 44B places a wafer J on the transfer stage TS2, as described above (see FIG. 32B). Thereafter, the processes described in connection with FIGS. 31A through 32B are repeated.

Such parallel processing is suitable for a simple polishing process (e.g., primary and secondary polishing or only primary polishing) and can considerably improve the throughput of the apparatus.

Although certain preferred embodiments of the present invention have been shown and described in detail, it should be understood that various changes and modifications may be made therein without departing from the scope of the appended claims.

What is claimed is:

1. A polishing apparatus for polishing a workpiece, said polishing apparatus comprising:
    a polishing unit including:
        a polishing table having a polishing surface thereon; and
        a top ring for pressing the workpiece against said polishing surface; and a cleaning unit including:
        a rotatable shaft configured to be vertically movable;
        a plurality of holding mechanisms mounted to said rotatable shaft for detachably holding the workpiece; and
        a plurality of cleaning devices disposed around said rotatable shaft for cleaning the workpiece which has been polished in said polishing unit.

2. The polishing apparatus according to claim 1, wherein said plurality of cleaning devices is disposed concentrically with said rotatable shaft.

3. The polishing apparatus according to claim 1, wherein said at least one holding mechanism comprises a vacuum chucking mechanism.

4. The polishing apparatus according to claim 1, wherein said plurality of holding mechanisms comprise a chucking member for holding a periphery of the workpiece.

5. The polishing apparatus according to claim 1, wherein the number of said plurality of holding mechanism is larger than the number of said plurality of cleaning devices.

* * * * *